(12) United States Patent
Hikita et al.

(10) Patent No.: US 6,571,530 B1
(45) Date of Patent: Jun. 3, 2003

(54) COMPONENT TAPING METHOD AND APPARATUS

(75) Inventors: Osamu Hikita, Yamanashi (JP); Susumu Kubo, Oume (JP); Kazunori Oshima, Iruma (JP)

(73) Assignees: Matsushita Electric Industrial Co., Ltd, Osaka (JP); Nihon Garter Co., Ltd., Tokyo (JP); Daiichi Co., Ltd., Saitama (JP)

( * ) Notice: Subject to any disclaimer, the term of this patent is extended or adjusted under 35 U.S.C. 154(b) by 0 days.

(21) Appl. No.: 09/341,713

(22) PCT Filed: Jan. 14, 1998

(86) PCT No.: PCT/JP98/00117
§ 371 (c)(1),
(2), (4) Date: Aug. 27, 1999

(87) PCT Pub. No.: WO98/32160
PCT Pub. Date: Jul. 23, 1998

(30) Foreign Application Priority Data

Jan. 17, 1997 (JP) ................................. 9-006350

(51) Int. Cl.⁷ ............................................ B65B 57/00
(52) U.S. Cl. ............................. 53/53; 53/55; 53/430; 53/500; 29/712
(58) Field of Search .................... 53/53, 430, 500, 53/55, 52; 29/709, 712

(56) References Cited

U.S. PATENT DOCUMENTS

| | | | | |
|---|---|---|---|---|
| 3,830,608 A | * | 8/1974 | Sebastian | 425/103 |
| 3,840,198 A | * | 10/1974 | Moore | 242/118.4 |
| 4,093,143 A | * | 6/1978 | Escue | 242/75.51 |
| 4,624,421 A | * | 11/1986 | Takeuchi | 242/77 |
| 4,681,221 A | | 7/1987 | Chickanosky et al. | |
| 4,810,154 A | * | 3/1989 | Klemmer et al. | 414/222 |
| 5,191,693 A | * | 3/1993 | Umetsu | 29/429 |
| 5,235,164 A | * | 8/1993 | Noyama et al. | 235/375 |
| 5,289,625 A | * | 3/1994 | Umetsu et al. | 29/426.3 |
| 5,299,902 A | * | 4/1994 | Fujiwara et al. | 414/416 |
| 5,472,085 A | | 12/1995 | Gelzer | |
| 5,566,447 A | * | 10/1996 | Sakurai | 295/832 |
| 5,622,333 A | * | 4/1997 | Jacques | 242/578.2 |
| 5,760,481 A | * | 6/1998 | Murayama | 257/787 |
| 5,769,236 A | * | 6/1998 | Maruyama et al. | 206/714 |
| 6,003,675 A | * | 12/1999 | Maruyama et al. | 206/713 |

FOREIGN PATENT DOCUMENTS

| | | | | |
|---|---|---|---|---|
| EP | 0 660 655 | | 6/1995 | |
| JP | 4-6055 | | 1/1992 | |
| JP | 6-156562 | | 6/1994 | |
| US | 5526936 | * | 6/1996 | 206/724 |

\* cited by examiner

Primary Examiner—Eugene Kim
Assistant Examiner—Christopher Harmon
(74) Attorney, Agent, or Firm—Wenderoth, Lind & Ponack, L.L.P.

(57) ABSTRACT

A component holder is reeled out from a storage reel and conveyed to a component-storage working position by a conveyor device. A control unit stops the conveyance of the component holder if it receives a non-storage or incomplete-storage signal. The component holder includes a multiplicity of component storages for storing the components therein are provided longitudinally and each has an opening on one surface. Each of the component storages has a shutter which becomes stable both at a projectional position and at a retreat position. The shutter is moved between the two positions by more than a certain sufficient level of urging force. The components are stored in the component storages with the shutters in the retreat positions, while the openings of the component storages are directed upward. The shutter of each component storage after the components have been stored therein moved to the projectional position and closed, and the components are taped one after another so as to be formed into continuous taped components.

22 Claims, 17 Drawing Sheets

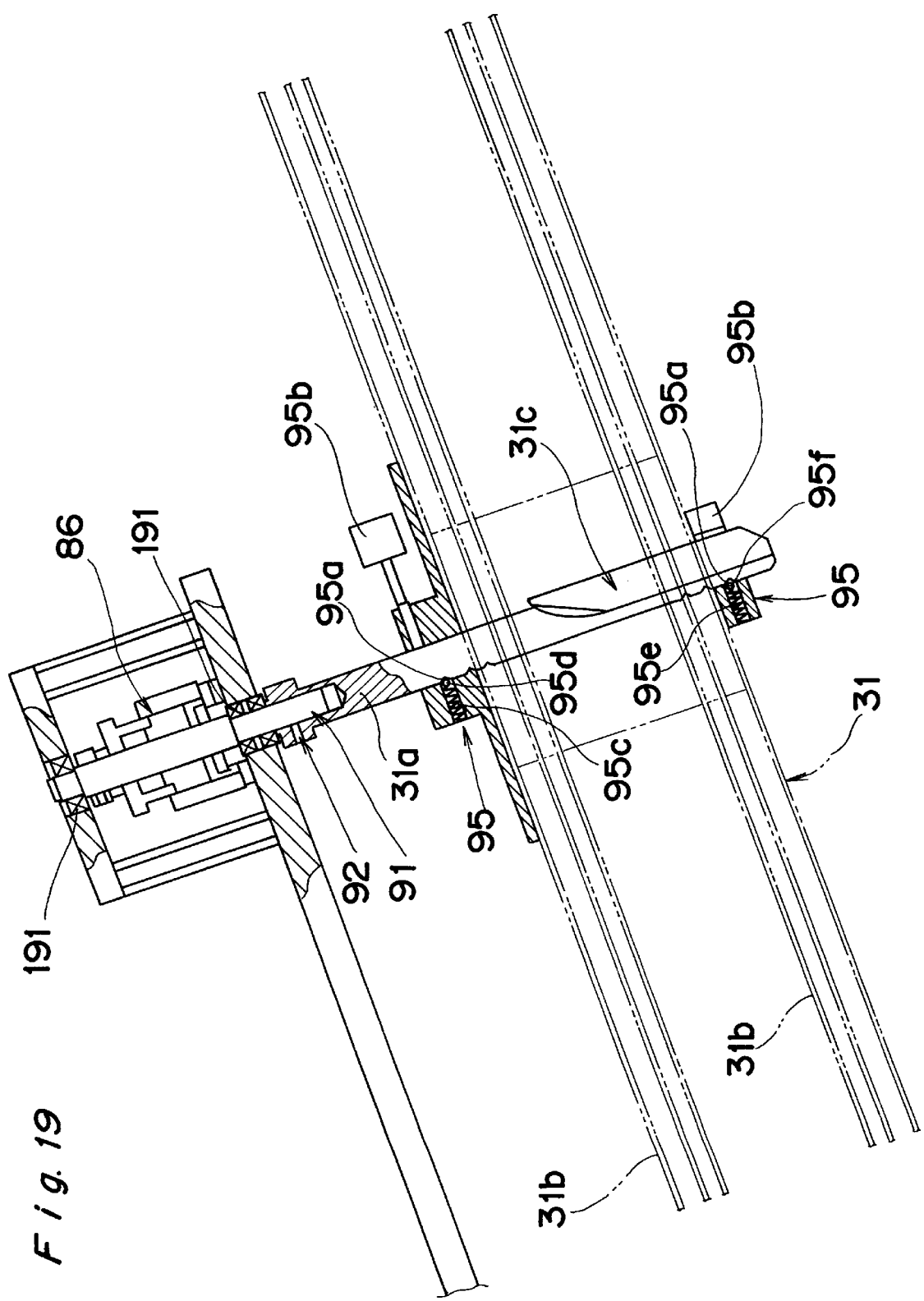

COMPONENT TAPING METHOD AND APPARATUS

TECHNICAL FIELD

The present invention relates to method and apparatus for taping components. The invention relates to component taping method and apparatus for taping components in such a way that the components are formed into continuous taped components, at least by using a component holder in which a multiplicity of component storages for storing components are provided longitudinally so as to be opened over one surface, and by storing and holding the components one by one in the individual component storages of the component holder.

BACKGROUND ART

This type of taping is applied, for example, to automatic feed of components in producing electronic circuit boards by mounting a multiplicity of, and a variety of, types of minute electronic components onto circuit boards. With components taped, it becomes easy to achieve the automatic feed of stored components to a specified position for use in the succeeding stage with high speed and high reliability, by conveying the taped components along their longitudinal direction, even if minute and numerous components are involved.

The component holder is designed to have a width matching the type of components. For automatically taping the components by using this component holder, the component taping apparatus treats the components, in most cases, in a way so that the component holder is automatically conveyed while being guided along a specified path, so that the components are made available for storage to the individual storages.

Guide or conveyor means of the component taping apparatus, if mismatched to the width of the component holder, would be unable to achieve a precision conveyance matching the minute components, causing mis-storage of components. Thus, a guide mechanism "a" and a conveyance mechanism "b" as shown in FIG. 18 have conventionally been used. In the guide mechanism "a", right-and-left guides "p" are attached on a right-and-left pair of support walls "c", and right-and-left edges "e" of a component holder "d" are placed on stepped-down surfaces "p1" of this right-and-left pair of guides "p", respectively, so that the component holder "d" is guided so as to be conveyed along a specified direction at a specified height. In the conveyance mechanism "b", a right-and-left pair of sprockets "g" are fitted to feed holes "f" provided at the right-and-left edges "e" of the guided component holder "d" so as to convey the component holder "d" along the guides "p". These sprockets "g" are provided in the front and rear of the conveyance direction and driven by transmission of power from a drive motor "h".

Both right and left sprockets "g" on the upstream side of the conveyance direction are supported by a spline shaft "j" transversely provided on a base "i", so that those sprockets "g" are axially movable and integrally rotatable. Both right and left sprockets "g" on the downstream side of the conveyance direction are supported by another spline shaft "k" transversely provided on the base "i", so that those sprockets "g" are axially movable and integrally rotatable.

Also, the right-hand sprockets "g" are fitted to the right-hand support wall "c" so as to be axially and integrally movable in the axial direction of the sprocket and singly rotatable, while the left-hand sprockets "g" are fitted to the left-hand support wall "c" so as to be axially and integrally movable in the axial direction of the sprocket and singly rotatable. Screw shafts "m" transversely provided on the base "i" are screwed to the right-and-left support walls "c" on their upstream and downstream sides in the conveyance direction. The screws are reverse directed between a portion of each screw shaft "m" screwed to the right-hand support wall "c" and another portion screwed to the left-hand support wall "c", where a handle "n" coupled to one screw shaft "m" is provided while the screw shafts "m" are coupled to each other with a belt "O".

Rotating the screw shafts "m" forward or reverse by operation of the handle "n" causes the right-and-left support walls "c" to be moved away from or closer to each other by the reversed screws so that the spacing therebetween is expanded or contracted. By this operation, the spacing between the right-and-left guides "p" as well as the spacing between the right-and-left sprockets "g" can be adjusted so as to match the widths of various types of the component holder "d" involved case by case, so that the component holder "d" can be guided and conveyed with high precision and therefore made available for the storing of components with stability.

On the other hand, the present applicant has previously proposed a component holder that prevents components stored in the component storages from falling out, and that allows the components to be stably held in the storage state and treated without cover tape which has conventionally been used for the component holder (Japanese Laid-Open Patent Publication No. 6-156562). In this case, each component storage of the component holder is provided with engaging pieces which are projected in the opening of the component storage so as to prevent the component stored in the component storage from falling off. The engaging pieces are molded integrally with the component storage and elastically deformable. When components are stored in the component storages, the engaging pieces are forcedly operated to be retreated out of the opening of the component storages. Therefore, the engaging pieces will not hinder the components from being stored in the component storages, and will be restored to their original positions and closed when released from the retreating operation after the storing of the components. Thus, the components stored in the component storages are engagedly fitted to the component storages in the stored state, and prevented from falling out.

However, in the conventional component taping apparatus shown in FIG. 18, the spacing between the guides "p" as well as the spacing between the sprockets "g" can be freely adjusted. However, there are no marks for matching the spacings to the width of the component holder "d" involved case by case so that a correct matching can hardly be achieved. As a result, the spacing adjustment would take longer time through iterated operations during ontrial conveyance of the component holder "d" or other processes, and the guidance and conveyance of the component holder "d" would in some rasps become unstable, causing mis-storage or mis-holding of components. Besides, the guide mechanism "a" and the conveyance mechanism "b" are wholly given in a unit form, resulting in complex structure and high cost.

Also, the engaging pieces of the component holder previously proposed by the present applicant are operated to be retreated both when components are stored in the component storages and when components used for the feeding of components in the form of taped components in which the components are stored in the individual component storages of the component holder are taken out. However, the engaging pieces will lower by the force of restoration to the closed state due to a creeping phenomenon or the like during iterated use of the component holder, so that the holding of components becomes unstable in some cases, causing mis-storage and mis-holding of components.

SUMMARY OF THE INVENTION

An object of the present invention is to provide a component taping method and apparatus which are unlikely to cause such mis-storage and mis-holding of components, as well as to solve the aforementioned various problems.

In accomplishing these and other aspects, according to a first aspect of the present invention, there is provided a component taping method comprising handling a component holder by winding the component holder around a reel, in which the component holder has a multiplicity of component storages (i.e., storage compartments) provided longitudinally and has an opening on one surface. Each of the component storages stores a component therein, and has a shutter which becomes stable both at a projectional position where the shutter is projected into the opening to thereby prevent the component from falling off, and at a retreat position where the shutter is retreated from the projectional position. The shutter is moved between the two positions by a more than certain level of urging force. The component holder is reeled out from the reel so that the openings of the component storages of the component holder are directed upward. The components are placed into the component storages reeled out and directed upward with the shutter stably in the retreat position. The shutter of each component storage in which the component has been stored is moved to the projectional position and then closed. Then the components are taped one after another so that the components are formed into continuous taped components, and the taped components are wound around the reel.

According to a second aspect of the present invention, there is provided a component taping apparatus comprising a conveyor device and a shutter closing device.

The conveyor device longitudinally conveys a component holder with openings of component storages of the component holder directed upward so that components are made available for storage at an intermediate component-storage working position. The component holder has the multiplicity of component storages provided longitudinally and has the openings on one individual surface. Each of the component storages serves for storing a component therein and has a shutter which becomes stable both at a projectional position where the shutter is projected into the opening to thereby prevent the components from falling off, and at a retreat position where the shutter is retreated from the projectional position, and the shutter is moved between the two positions by a more than a certain level of urging force.

The shutter closing device moves the shutter of each component storage of the component holder from the retreat position to the projectional position, on a downstream side of the component-storage working position and thereby closes the shutter.

According to a third aspect of the present invention, there is provided the component taping apparatus according to the second aspect, further comprising a shutter opening device for moving the shutter located in the projectional position in each component storage of the component holder on an upstream side of the component-storage working position to the retreat position, and thereby opening the shutter.

According to a fourth aspect of the present invention, there is provided the component taping apparatus according to any one of the second and third aspects, further comprising between the component-storage working position and the shutter closing position an incomplete-storage sensor and a control means. The incomplete-storage sensor for detects an incomplete-storage state of the component stored in each component storage, and the control means stops the conveyor device when an incomplete-storage signal derived from the incomplete-storage sensor is present.

According to a fifth aspect of the present invention, there is provided the component taping apparatus according to the fourth aspect, further comprising a component sensor between the component-storage working position and the shutter closing position. The component sensor detects whether or not a stored component is present in each component storage. The control means then stops the conveyor device when at least one of the incomplete-storage signal and a non-storage signal derived from the incomplete-storage sensor and the component sensor is present.

According to a sixth aspect of the present invention, there is provided a component taping apparatus comprising a pair of guide members, a conveyor device, a support member, a positioning and holding device, and a linkage device.

The pair of guide members is provided for longitudinally guiding a component holder, in which a multiplicity of component storages for storing components therein are provided longitudinally and having openings on individual one surface, in a state such that the openings of the component storages are directed upward on both sides of the component holder. The conveyor device conveys the component holder along the guide members while a right-and-left pair of sprockets are engaged with feed holes on both sides of the component holder guided by the guide members so that the components are made available for storage at an intermediate componentstorage working position. The support member supports the pair of guide members so that the guide members can be moved individually to a plurality of particular positions corresponding to widths of component holders involved case by case. The positioning and holding device is provided for positioning and holding each of the pair of guide members at a required one of the particular positions involved case by case by selectively using one of the positioning portions independently provided at the plurality of particular positions on the support member. The linkage device is provided for moving one of the pair of sprockets in linkage with movement of a corresponding one of the pair of guide members.

According to a seventh aspect of the present invention, there is provided the component taping apparatus according to the sixth aspect, further comprising a feed reel, a wind-up reel, and a reel flange-positioning device.

The feed reel is provided for reeling out and feeding the component holder to the conveyor device. The wind-up reel winds up the taped components which are conveyed up by the conveyor device and which have been stored in the component storages, and each of the feed reel and the wind-up reel has a reel flange that can be moved axially on a rotating shaft. The reel flange-positioning device elastically engages the reel flange in the plurality of particular positions corresponding to the widths of the component holders involved case by case on the rotating shaft of each of the reels, and thereby engagedly fixes the reel flange.

According to an eighth aspect of the present invention, there is provided the component taping apparatus according to any one of the second through seventh aspects, further comprising a setting device and a control means. The setting device sets a one-time feed number of component storages to be made available for component storage at a one-time stop by intermittently conveying the component holder by the conveyor device. The control means drives the conveyor device in steps of a pitch corresponding to the one-time feed number of component storages set by the setting device in response to each-time conveyance of the component holder.

According to a ninth aspect of the present invention, there is provided the component taping apparatus according to the eighth aspect, wherein the control means has such a function that when the number of component storages equipped in the component holder is indivisible by the set one-time feed number of component storages, the conveyor device is driven at last-time conveyance of the component holder by a pitch corresponding to the indivisible odd number of component storages.

According to a tenth aspect of the present invention, there is provided the component taping apparatus according to any one of the second through eighth aspects, wherein the component holder has holder units. Each of the holder units is made of synthetic resin having flexibility and comprises the component storage having an opening over one face so as to allow the component to be stored, and a flange integrally molded around the opening. Coupling holes are provided right and left of one of the front and rear edges formed by the flange, and hooks are provided right and left of the other of the front and rear edges, both by integral molding. When the holder units are arrayed front and rear, adjacent corresponding coupling hole and hook are opposed up and down and fitted to each other in an anti-disengaging state so that adjacent holder units are coupled to each other, thus forming the component holder.

With this constitution, the component holder having the multiplicity of component storages in the longitudinal direction is reeled out from the reel and conveyed longitudinally, handled without disturbances, in which operation the openings of the individual component storages reeled out from the reel and conveyed are directed upward. Therefore, if the shutters are in the retreat position, i.e., if the component holder is unused with all the shutters opened in the retreat positions, then the shutters may remain as they are. On the other hand, if the component holder is reused with the shutters in the projectional positions, then the shutters are moved to the retreat positions so as to be opened, in whichever state the components can be stored, and stabilized one by one in the component storages on the way of conveyance. Further, for the component storages after they have stored the components, because their shutters are moved to the projectional positions, forcedly closed, without relying on their restoring force, the components stored in the component storages are engagedly held in their stored state without being affected by changes in the restoring force with which the shutters are restored to the closed state or other occurrences. Thus, the components can be taped one by one into a state such that once stored components can reliably be prevented from falling out. Moreover, since the taped components after the taping are wound around the reel, the components become easy to handle afterwards and, what is more, it becomes more likely to avoid such a possibility that the shutters are unexpectedly moved to the retreat positions under some external force during various types of handling before the feeding of components so that the components may fall off or come to a falling-off state. For this purpose, it is further preferable that the components are wound around the reel in such a fashion that the shutters come to the rear side of the reel. With these arrangements, from a time point when the components are stored in the component storages until another time point when the components are made available for the feeding of components, there can be eliminated or reduced possibilities of mis-storage and mis-holding of components, i.e., possibilities that some components have not been stored and that components, if stored, are in an unholdable state.

As the apparatus for taping components by using the component holder, it is possible to provide the component taping apparatus comprising the conveyor device for longitudinally conveying the component holder with the openings of the component storages of the component holder directed upward so that components are made available for storage at the intermediate component-storage working position, and the shutter closing device for moving the shutter of each component storage of the component holder from the retreat position to the projectional position, on the downstream side of the component-storage working position, and thereby closing the shutter. With this component taping apparatus, a taping performance which is reliable in component holding without relying on the restoring force of the shutter and which is unlikely to cause mis-storage or mis-holding of components can be automatically achieved.

It is also possible to provide the component taping apparatus further comprising the shutter opening device for moving the shutter located in the projectional position in each component storage of the component holder on an upstream side of the component-storage working position to the retreat position, and thereby opening the shutter. With this component taping apparatus, even if the component holder is reused so that some shutter has been moved to the projectional position, the shutter is moved to the retreat position and opened before the component is stored in the component storage, so as not to disturb the storing of component, thus preventing occurrences of mis-storage and mis-holding of components.

In the component taping apparatus, it is also possible to provide the reel on which the component holder is wound up for use of conveyance of the component holder, and the reel for winding up the taped components after the taping. Then, the component taping apparatus is enabled to automatically achieve the aforementioned component taping method.

It is also possible to provide the component taping apparatus further comprising between the component-storage working position and the shutter closing position: the incomplete-storage sensor for detecting the incomplete-storage state of the component stored in each component storage; the component sensor for detecting whether or not the stored component is present in each component storage; and the control means for stopping the conveyor device when at least one of the incomplete-storage signal and the non-storage signal derived from the incomplete-storage sensor and the component sensor is present. With this component taping apparatus, even after the passage of each component storage over the component-storage working position, if either an incomplete-storage state in which a component is incompletely stored in the component storage, floated or partly projected, or a non-storage state in which a component is not stored has occurred due to some reason, the incompletestorage sensor or the non-storage sensor detects one of those states before the component storage reaches the shutter closing position. If at least one of the incomplete-storage signal and the non-storage signal is present, the control means stops the conveyor device. Therefore, taking advantage of the fact that the shutter is opened in the retreat position in the component storage that has been detected for the incomplete storage or non-storage, measures can be taken such as putting the incompletely stored component into a specified stored state or storing the non-stored component. Moreover, there can be prevented such possibilities that, with the component floated or partly projected, the shutter is moved to the projectional position and resultantly damaged, or that the component is popped out or the popped-out component bites into the parts of the apparatus, causing trouble.

Also, the taping apparatus for taping components by using the component holder in which the multiplicity of component storages for storing components therein are provided longitudinally and have the opening on one surface comprises: the pair, of guide members for longitudinally guiding the component holder in a state in which the openings of the component storages are directed upward on both right-and-left sides of the component holder; the conveyor device for conveying the component holder along the guide members while a right-and-left pair of sprockets are engaged with feed holes on both sides of the component holder guided by the guide members so that the components are made available for storage at the intermediate componentstorage working position; the support member for supporting the pair of guide members so that the guide members can be moved individually to a plurality of particular positions corresponding to widths of component holders involved case by case; the positioning and holding device for positioning and holding each of the pair of guide members to a required one of the particular positions involved case by case by selectively using one of positioning portions independently provided at the plurality of particular positions on the support member; and the linkage device for moving one of the pair of sprockets in linkage with movement of the corresponding one of the pair of guide members.

With this constitution, in the operation that while the component holder is longitudinally guided by the guide members and conveyed by the conveyor device, the components are stored in its component storages and automatically taped, the right-and-left guide members that guide the component holder can be moved individually to a plurality of particular positions corresponding to the widths of various component holders on the support member for these members. One of those particular positions corresponding to the widths of the particular component holders involved case by case is selected, and the right-and-left guide members are positioned and held with respect to positioning portions provided at the particular positions by the positioning and holding device.

By doing so, the right-and-left guide members can be fixed with simplicity and correctly to positions matching the particular component holder involved. At the same time, one of the right-and-left sprockets of the conveyor device that is conveyed in engagement with the right-and-left portions of the component holder is moved in linkage with the corresponding one of the right-and-left guide members by the linkage device, thus being positioned correctly at the positions matching the width of the component holder involved. Therefore, the component holder can be guided and conveyed with high precision, so that occurrence of misstorage or mis-holding of components can be prevented from taking place due to unstable guidance or conveyance of the component holder. Moreover, the right-and-left guide members have no relation to each other and are of such a simple structure as to be only linked with the sprockets on their corresponding side of the conveyor device. Thus, the apparatus cost is reduced as compared with the conventional apparatus.

The component taping apparatus may further comprise: the feed reel for reeling out and feeding the component holder to the conveyor device; the wind-up reel for winding up the taped components which are conveyed up by the conveyor device and which have been stored in the component storages, each of the feed reel and the wind-up reel having the reel flange that can be moved axially on the rotating shaft; and the reel flange-positioning device for elastically engaging the reel flange in the plurality of particular positions corresponding to the widths of the component holders involved case by case and thereby engagedly fixing the reel flange. In this case, the feed reel and windup reel can also be instantaneously moved correctly to their required positions, by selecting the elastic engaging positions of the reel flange-positioning device provided at particular positions corresponding to the widths of various types of component storages on their rotating shafts, by virtue of alight movement against the elastic engaging force of the reel flange-positioning device as well as the sound and feeling at the time of an elastic engagement of the reel flange positioning device.

BRIEF DESCRIPTION OF DRAWINGS

These and other aspects and features of the present invention will become clear from the following description taken in conjunction with the preferred embodiments thereof with reference to the accompanying drawings, in which:

FIG. 6A is a plan view thereof and FIG. 6B is a side view thereof;

FIG. 7A is a plan view thereof and FIG. 7B is a side view thereof;

FIG. 10A is a plan view thereof and FIG. 10B is a side view thereof;

FIG. 16 is a perspective view of a component feed cassette to be used for feeding taped components taped by the apparatus of FIG. 1 or the like;

FIG. 19 is an enlarged view of the guide means in FIG. 11.

DETAILED DESCRIPTION OF THE INVENTION

Figure 1:
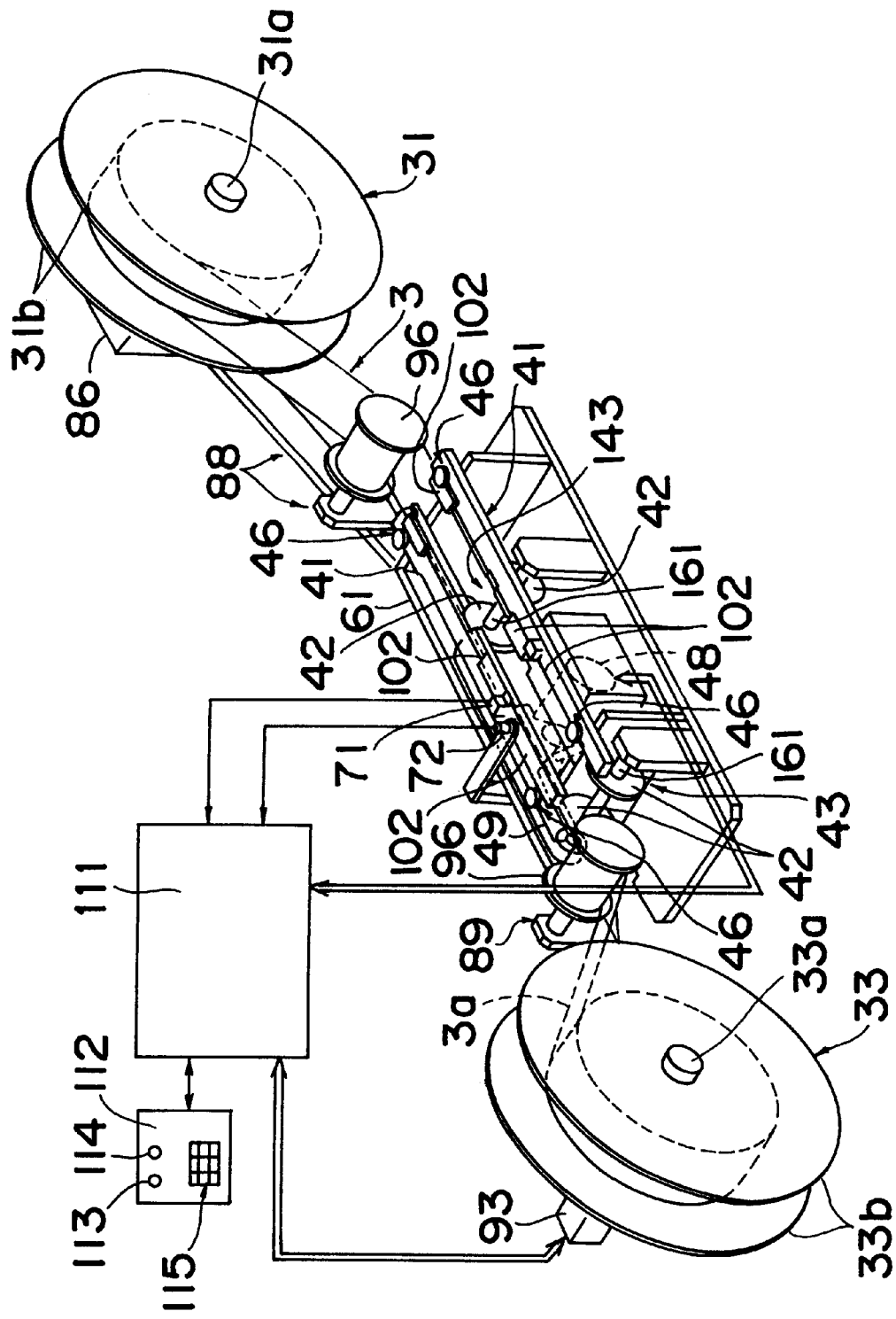
FIG. 1 is a perspective view showing a component taping apparatus according to an embodiment of the present invention.

Before the description of the present invention proceeds, it is to be noted that like parts are designated by like reference numerals throughout the accompanying drawings.

Hereinbelow, a typical embodiment of the component taping method and apparatus according to the present invention is described with reference to FIGS. 1 to 17.

Figure 2:
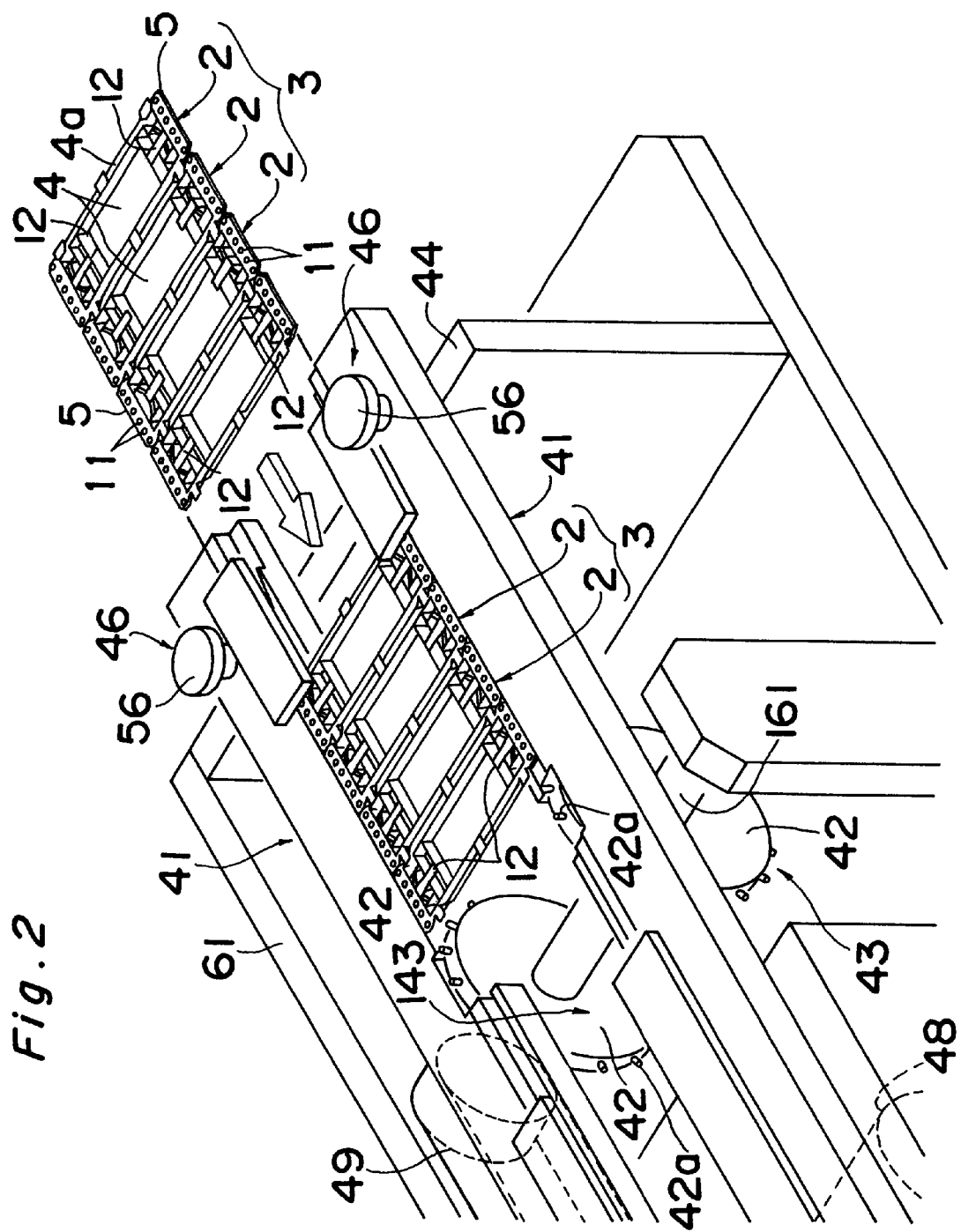
FIG. 2 is a perspective view of an upstream side portion in the conveyance direction in a state of use of the apparatus of FIG. 1, excluding the feed reel part.
Figure 3:
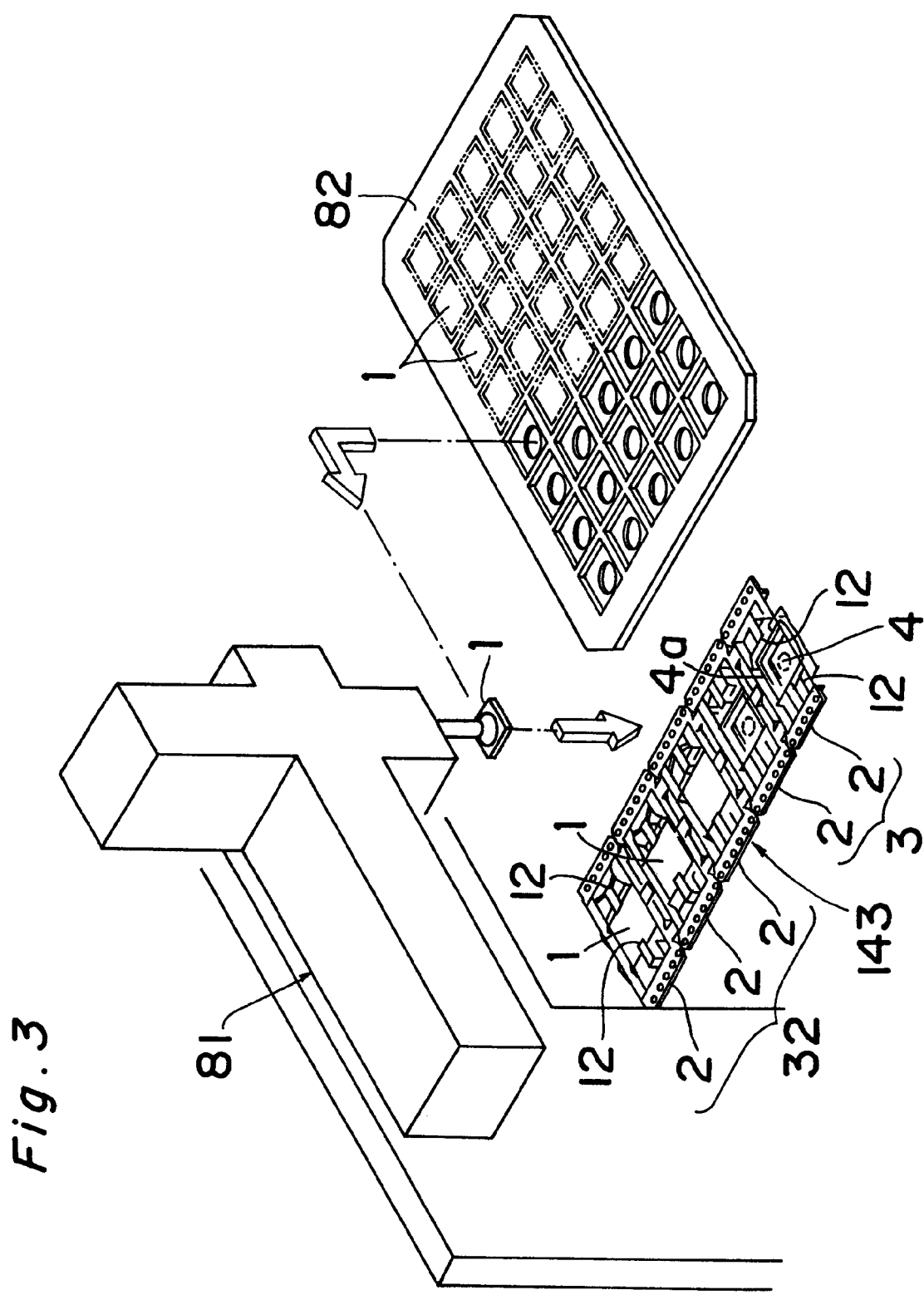
FIG. 3 is a perspective view of a component-storage working state of the apparatus of FIG. 1, shown by an example of the state of use.
Figure 4:
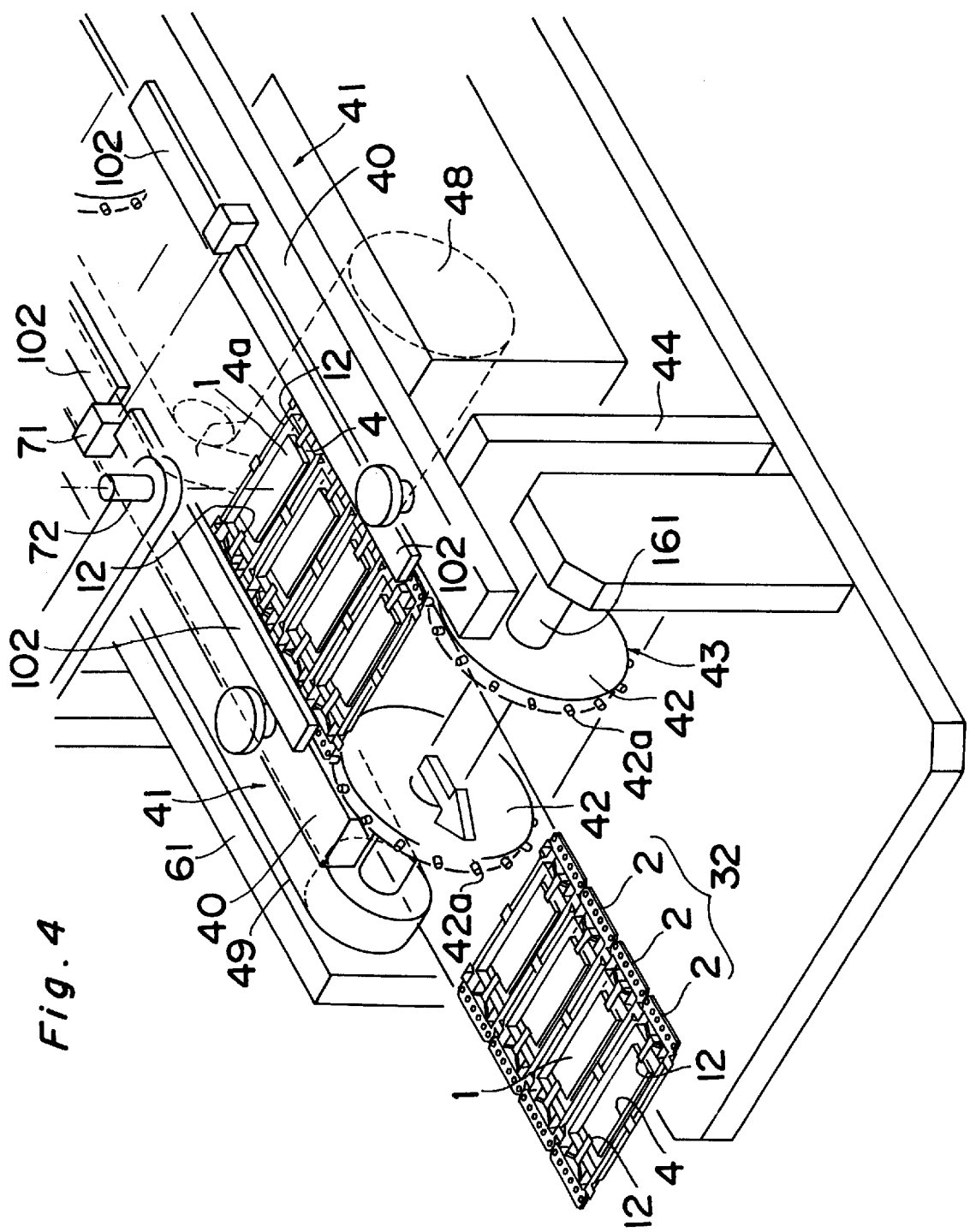
FIG. 4 is a perspective view of a downstream side portion in the conveyance direction in a state of use of the apparatus of FIG. 1, excluding the wind-up reel part.

This embodiment is shown in FIGS. 1 to 12, showing a case where various chip types of electronic components 1 as shown in FIGS. 2 to 4 are taped. However, without limitations to this, any type of component may be treated. Also, this embodiment shows a case in which a multiplicity of holder units 2 each of which stores and holds one electronic component 1 as shown in FIGS. 13 and 14 are coupled together to form a component holder 3 as shown in FIGS. 1 to 5.

Figure 13:
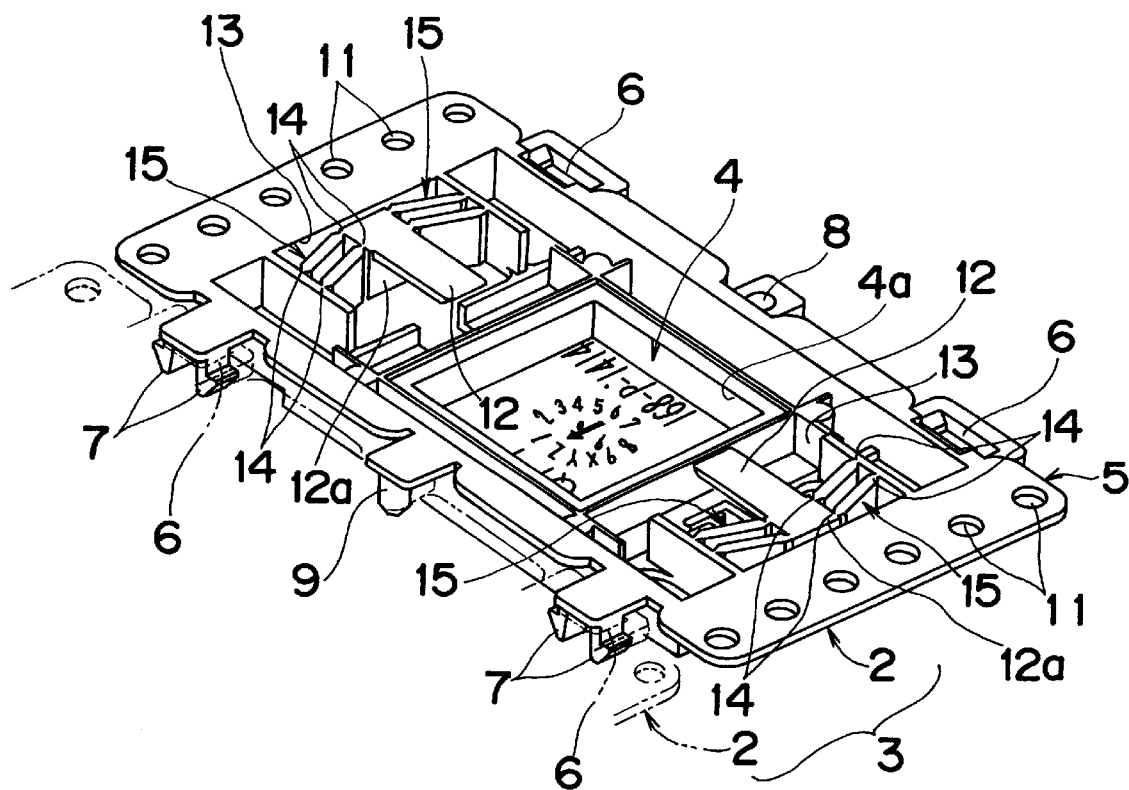
FIG. 13 is a perspective view of the holder unit having component storages constituting the component holder to be used in the apparatus of FIG. 1.
Figure 14:
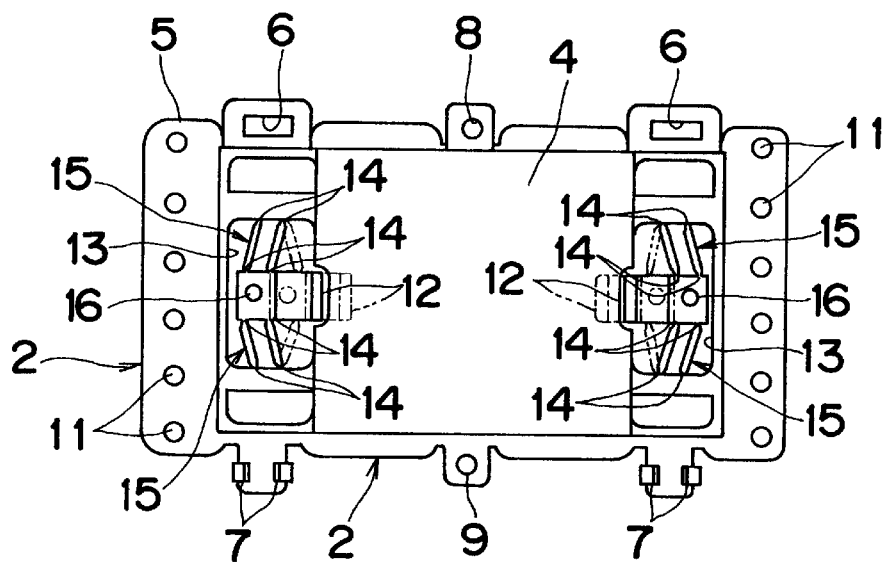
FIG. 14 is a rear side view of the holder unit of FIG. 13.

The holder unit 2, which is made of synthetic resin having flexibility, comprises a component storage 4 having an opening 4a over one face so as to allow the electronic component 1 to be stored, and a flange 5 integrally molded around the opening 4a as shown in FIG. 13. Coupling holes 6 are provided on the right and left sides of one of front and rear edges formed by the flange 5, and hooks 7 are provided right and left of the other of the front and rear edges, both by integral molding. When the holder units 2 are arrayed front and rear as shown in FIGS. 1 to 7, adjacent corresponding coupling hole 6 and hook 7 are opposed up and down and fitted to each other in an anti-disengaging state so that adjacent holder units 2 are coupled to each other as depicted by solid lines and imaginary lines in FIG. 13, thus forming a component holder 3.

Further, a coupling hole 8 is provided in a central portion of one of the front-and-rear edges of the flange 5, while a protrusion 9 is provided in a central portion of the other, both by integral molding. Adjacent corresponding coupling hole 8 and protrusion 9 are fitted to each other in the coupling state, thus enhancing the coupling strength in the conveyance of the component holder 3. However, these members have only to be provided as required.

In the right-and-left edge portions of the flange 5, a plurality of feed holes 11 are provided at a regular pitch so that even when the holder units 2 are coupled together, the pitch of the feed holes 11 does not change even between adjacent feed holes 11. As a result, even the component holder 3 in which a multiplicity of holder units 2 are coupled together can be precision conveyed by virtue of the engagement with a sprocket 42 as shown in FIG. 1.

Between the right-and-left edge portions of the flange 5, on which the right-and-left feed holes 11 are formed, and the component storage 4 in each holder unit 2, there is provided a shutter 12 by integral molding, as shown in FIGS. 13 and 14. The shutter is stable both in a projectional position depicted by imaginary line in FIG. 14, in which the shutter 12 is projected into the opening 4a to prevent the electronic component 1 from falling off, and in a retreat position depicted by solid line in FIGS. 13 and 14, in which the shutter 12 is retreated from this projectional position, and the shutter 12 is moved between these two positions by more than a certain predetermined level of urging force. This shutter 12 is formed so as to extend like a tongue toward the opening 4a from a base 12a, which is located within a window 13 formed between the right-and-left edge portions of the flange 5 and the component storage 4. In the projectional position where the shutter 12 is projected into the opening 4a as shown by the holder unit 2 present at the left end portion of the component holder 3 of FIG. 4, the shutter 12 is fitted to the electronic component 1 stored in the component storage 4, preventing the electronic component 1 from leaping (i.e., being bumped, knocked, shaken or spilled so as to fall) out.

The shutter 12 is supported at its base 12a so as to be movable in parallel directions between the above two positions while being integrated with the holder unit 2. Specifically, the shutter is moved by parallel link pairs, 15 provided front and rear each in two pieces and coupled to each other by self hinges 14 between the front-and-rear surfaces of the base 12a and the front-and-rear wall surfaces of the window 13. When the base 12a is moved between the two positions with more than a certain level of urging force against the tensional resistance due to the front-and-rear parallel link pairs 15, the shutter 12-can be stabilized to either of the two positions. In order to move the shutter 12 between the two positions, protrusions 16 as shown in FIGS. 5, 8, 9, and 14 are integrally molded at the lower surface of the base 12a. The coupling structure of the holder units 2, the moving structure of the shutter 12 and the form of the shutter 12 may be designed in various ways, as a variety of designs are disclosed in Japanese Patent Application No. 7-244452, which is a previous patent application of the present applicant, and the shutter 12 is not necessarily required to be integrally formed. The holder unit 2 of such a structure can be die-molded simply by virtue of being a unit body, and the shutter 12 may also be provided in association with a multiplicity of component storages 4 formed into one continuous tape, as the case may be.

Figure 15:
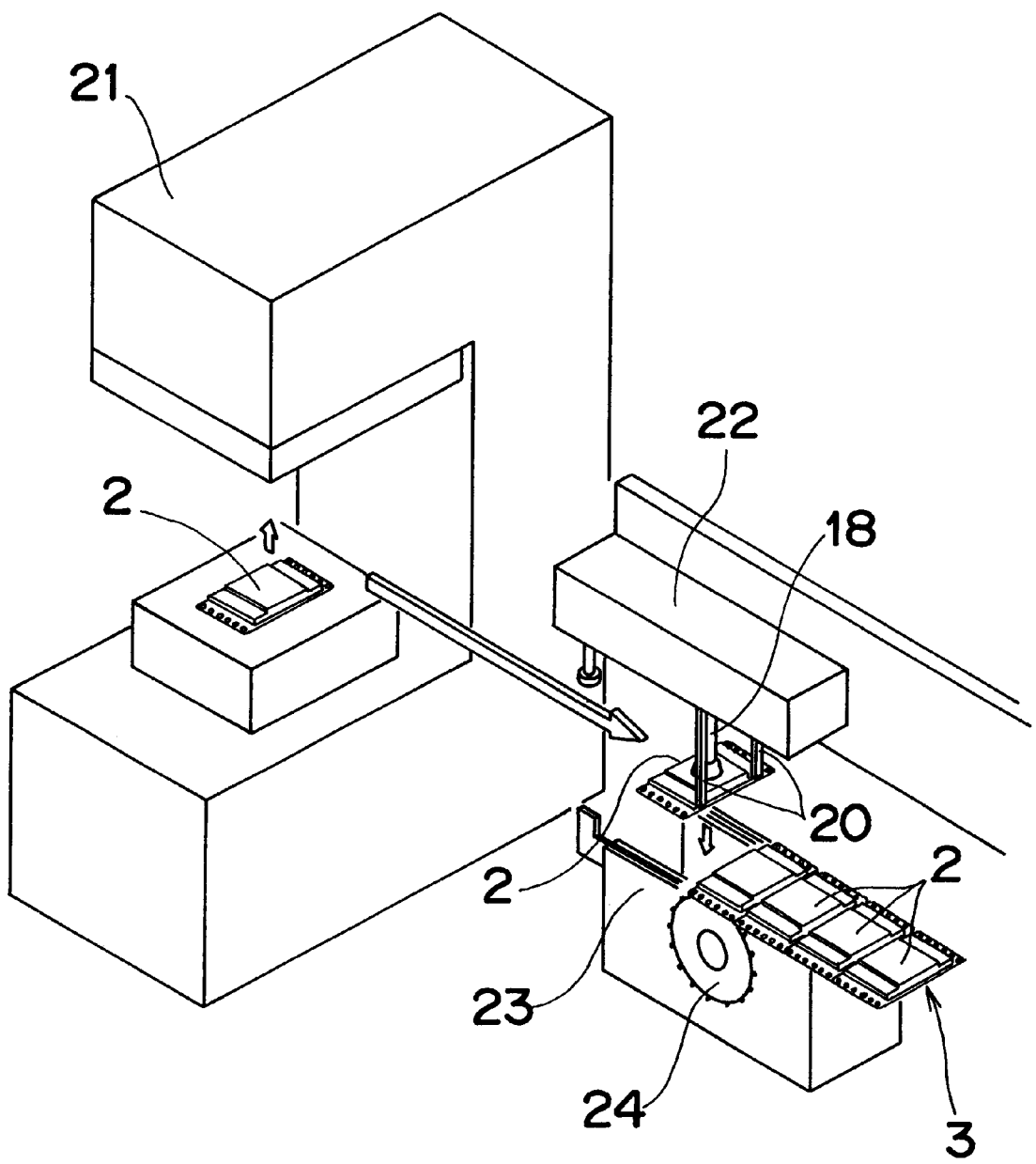
FIG. 15 is a perspective view showing a molding machine for the holder unit of FIG. 13 as well as a coupling device for coupling molded holder units one by one.

The holder unit 2 is injection-molded, for example, by molding equipment 21 as shown in FIG. 15. The molded holder unit 2 is picked up (sucked) by a pickup nozzle (suction nozzle) 18 of transfer means 22 serving as one example of the transfer device and then transferred onto a coupling portion 23 on which another previously molded holder unit 2 is placed. The hooks 7 of the transferred holder unit 2 are overlapped on the coupling holes 6 of the previously placed holder unit 2, in which state the hooks 7 are pressed from above by a presser member 20 equipped in the transfer means 22, by which the hooks 7 are fitted to the coupling holes 6. Thus, the holder unit 2 now transferred can automatically be coupled to the previously placed holder unit 2, forming a component holder 3. Each time the coupling is completed, the component holder 3 is fed by one pitch corresponding to one holder unit 2 by the sprocket 24. By iterating these operations, a component holder 3 in which a required number of holder units 2 are coupled together can be automatically and continuously produced, and automatically wound up around a feed reel 31 at the destination of conveyance of the component holder 3.

For the electronic components 1 to be taped by using the component holder 3 having the component storages 4 which each have a shutter 12, it is preferable to take the following steps. That is, the component holder 3 is treated by being wound around the feed reel 31 as shown in FIG. 1, and reeled out from the feed reel 31 as shown in FIG. 2 so that the openings 4a of the component storages 4 of the component holder 3 are directed upward as shown in FIGS. 2 to 4. Then, the electronic components 1 are stored one by one in the reeled-out and upward-directed component storages 4 in the opened state with the shutter 12 in the retreat position, by manual work or automatically as indicated by arrow in FIG. 3. The shutter 12 of each component storage 4 after the electronic component 1 has been stored therein is moved to the projectional position and closed. Thus, the electronic components 1 are taped one after another so as to be formed into continuous taped components 32 as shown in the left side portion of FIG. 4. The taped components 32 after the taping are wound up around a wind-up reel 33 as shown in FIG. 1.

With this arrangement, an elongated component holder 3 having a multiplicity of component storages 4 in the longitudinal direction is reeled out from the feed reel 31, conveyed longitudinally, and treated without disturbances, while the opening 4a of each component storage 4 reeled out from the feed reel 31 and conveyed is directed upward. Therefore, if the shutters 12 are opened in the retreat positions, i.e., if the component holder 3 is unused with all the shutters 12 opened in the retreat positions, then the shutters 12 may remain as they are. On the other hand, if the component holder 3 is reused with the shutters 12 closed in the projectional position, then the shutters 12 are moved to the retreat positions and opened. In either state, the electronic components 1 can be stored and stabilized one by one in the component storages 4 on the way of conveyance.

As to each component storage 4 after the electronic component 1 has been placed therein, the shutter 12 is moved to the projectional position and forcedly closed without relying on its restoring force, so that the electronic component 1 stored in the component storage 4 is engaged in their stored state without being affected by changes in the restoring force of the shutter 12 or the like. Therefore, the individual electronic components 1 can be taped one after another a state in which the stored electronic components 1 are surely prevented from falling out. Moreover, since the taped components 32 after the taping are wound around the wind-up reel 33, they become easy to handle afterwards, and it becomes more likely to avoid such a possibility that the shutters 12 are unexpectedly moved to the retreat positions under some external force during various types of handling before the feeding of components so that the electronic components 1 may fall off or be in a state in which they can fall off. In the state in which the taped components 32 of the wind-up reel 33 of FIG. 1 are wound up, the shutters 12 come to the rear side of the taped components 32. Therefore, even if the taped components 32 are wound up all the way around the outer diameter of a reel flange 33b, the shutters 12 will never be subject to any external force, more preferably.

A taping apparatus for automatically performing the taping of electronic components 1 in this way is shown in FIGS. 1 to 12. This apparatus, as shown in FIGS. 1, 2 and 4, comprises: a pair of guide means 41, serving as one example of the guide members, for longitudinally guiding the component holder 3 reeled out from the feed reel 31 while the openings 4a of the component storages 4 are directed upward on both right-and-left sides of the component holder 3; and a conveyor means 43 for conveying the component holder 3 along the guide means 41 in a state in which a right-and-left pair of sprockets 42 are engaged in the feed holes 11 on both sides of the component holder 3 guided by the guide means 41, thus making the component holder 3 available for the storing of the electronic components 1 at an intermediate component-storage working position 143. In this taping apparatus, the component holder 3 is automatically conveyed along the guide means 41 with precision. As FIG. 3 shows a state of use of the component taping apparatus according to this embodiment, the electronic components 1 or the like fed by, for example, a pallet 82 are automatically stored by, for example, a robot. However, the electronic components 1 or various types of components can be stored one after another by hand as well. The taped components 32 after the taping are wound up around the wind-up reel 33.

Especially in this embodiment, a support member 44 on a base 61, as shown in FIGS. 1, 2, 4 and 6A/6B to 10A/10B, is provided for supporting the pair of guide means 41 so as to individually move the guide means to a plurality of particular positions corresponding to the widths of the component holders 3 involved case by case. A positioning and holding means 46 serving as the positioning and holding device, as shown in FIGS. 1, 2, 4, 6A/6B and 7A/7B, is provided for positioning and holding the pair of guide means 41 at their then required particular positions, respectively, by selectively using positioning portions 45 shown in FIGS. 6A/6B, 7A/7B and 10A/10B and which are individually provided at the plurality of particular positions on the support member 44. A linkage means 47, serving as one example of the linkage device, is provided for moving the pair of sprockets 42 in linkage with the movement of their corresponding ones of the pair of guide means 41.

Thus, in the operation in which the component holder 3 is longitudinally guided by the guide means 41 and conveyed by the conveyor means 43, the electronic components 1 are stored in the component storages 4 of component holder 3 and automatically taped, the right-and-left guide means 41 that guide the component holder 3 can be moved individually to a plurality of particular positions corresponding to the widths of various component holders 3, for example, (holes) X1 to X3 (see FIGS. 10A/10B), on the support member 44 for these members. One of those particular positions, X1 to X3, corresponding to the widths of the particular component holders 3 involved case by case is selected, and the right-and-left guide means 41 are positioned and held with respect to positioning portions 45 provided at the particular positions by the positioning and holding means 46 as shown in FIGS. 1, 2, 4, 6A/6B and 7A/7B. By doing so, the right-and-left guide means 41 can be fixed with simplicity and correctly at positions matching the particular component holder 3 involved. At the same time, the right-and-left sprockets 42 of the conveyor means 43 that are conveyed in engagement with the right-and-left portions of the component holder 3 are moved in linkage with their corresponding right or left guide means 41 by the linkage means 47, thus being positioned correctly at the positions matching the width of the component holder 3 involved. Therefore, the component holder 3 can be guided and conveyed with high precision, so that when the electronic components 1 are automatically stored, for example, by a robot, mis-storage or mis-holding of components due to unstable guidance or conveyance of the component holder 3 can be prevented.

Moreover, the right-and-left guide means 41 are not connected to each other and are so structured as to be only linked with their corresponding-side sprockets 42 of the conveyor means 43. Thus, the apparatus cost is reduced lower than the conventional apparatus. As a matter of course, for fulfilling their features, it is not essential that the component holder 3 is of the coupling type or that each component storage 4 has shutters 12.

More specifically, the guide means 41 are implemented by bar-shaped guide rails 40 and, as shown in FIG. 2 and FIGS. 4 to 9, have stepped-down surfaces 40a at their opposing inner edges, so that right-and-left edge portions of the flange 5 of the component holder 3 are received on the stepped-down surfaces 40a. On condition that the aforementioned correct positioning is achieved, the guide means 41 are able to guide the component holder 3 in the longitudinal direction while its height and right-and-left positions are regulated with high precision. In this case, the sprockets 42 located at upstream and downstream specified positions in the conveyance direction of the guide rails 40 are fitted to the feed holes 11 provided on the right-and-left edge portions of the flange 5, and driven via a belt 49 by a motor 48 shown in FIGS. 1 and 10A/10B. Thus, the sprockets 42 are able to precisionally convey the component holder 3 under the guidance of the guide rails 40. However, as long as it is capable of guiding the component holder 3 with high precision and conveying it with high precision under this guidance, the guide means 41 may be any type regardless of how they support and guide the component holder 3, and the placement of the sprockets 42 as well-as the constitution of the drive system may also be designed in various ways.

Figure 11:
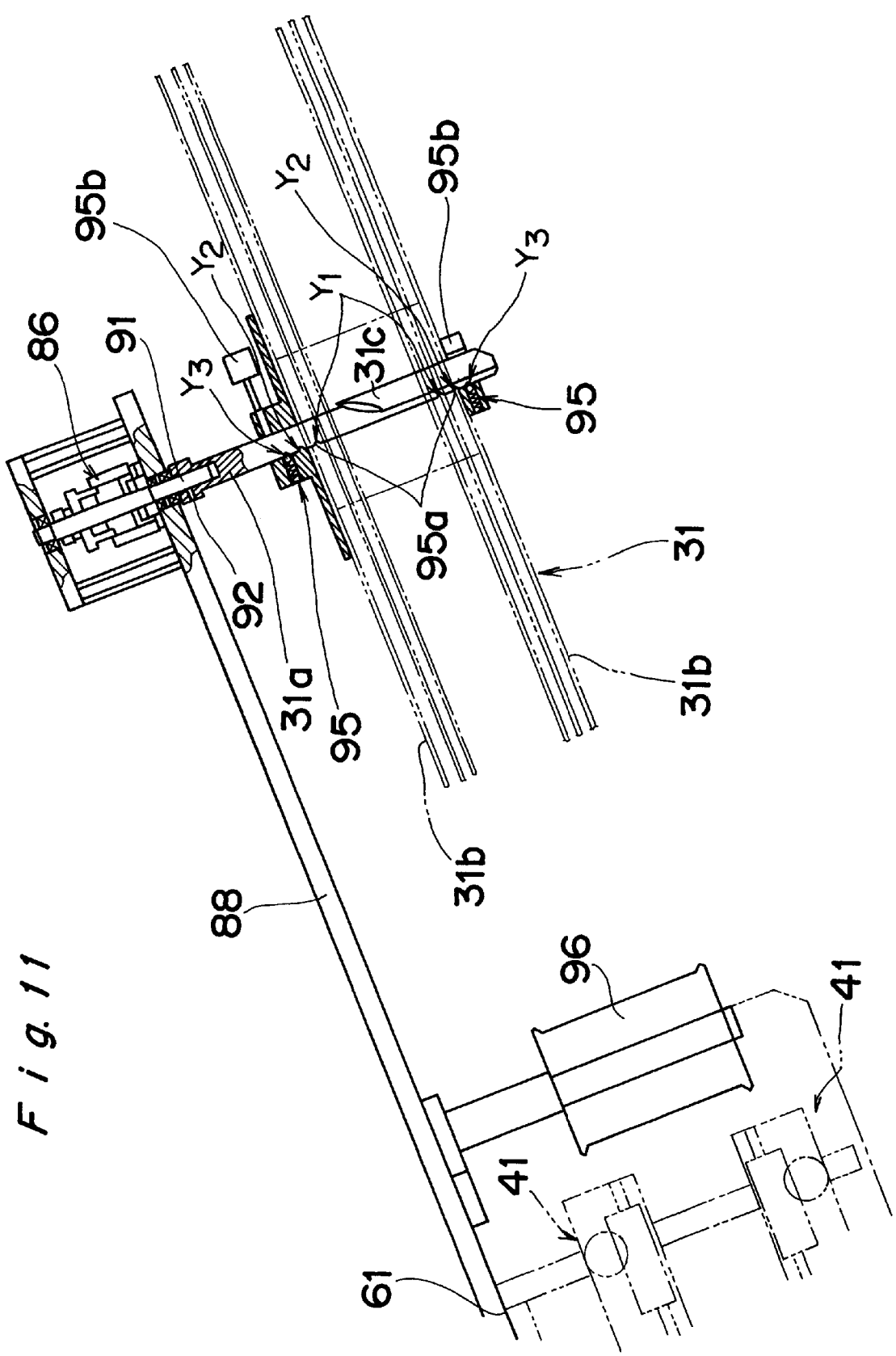
FIG. 11 is a sectional view of the feed reel part in the apparatus of FIG. 1.
Figure 12:
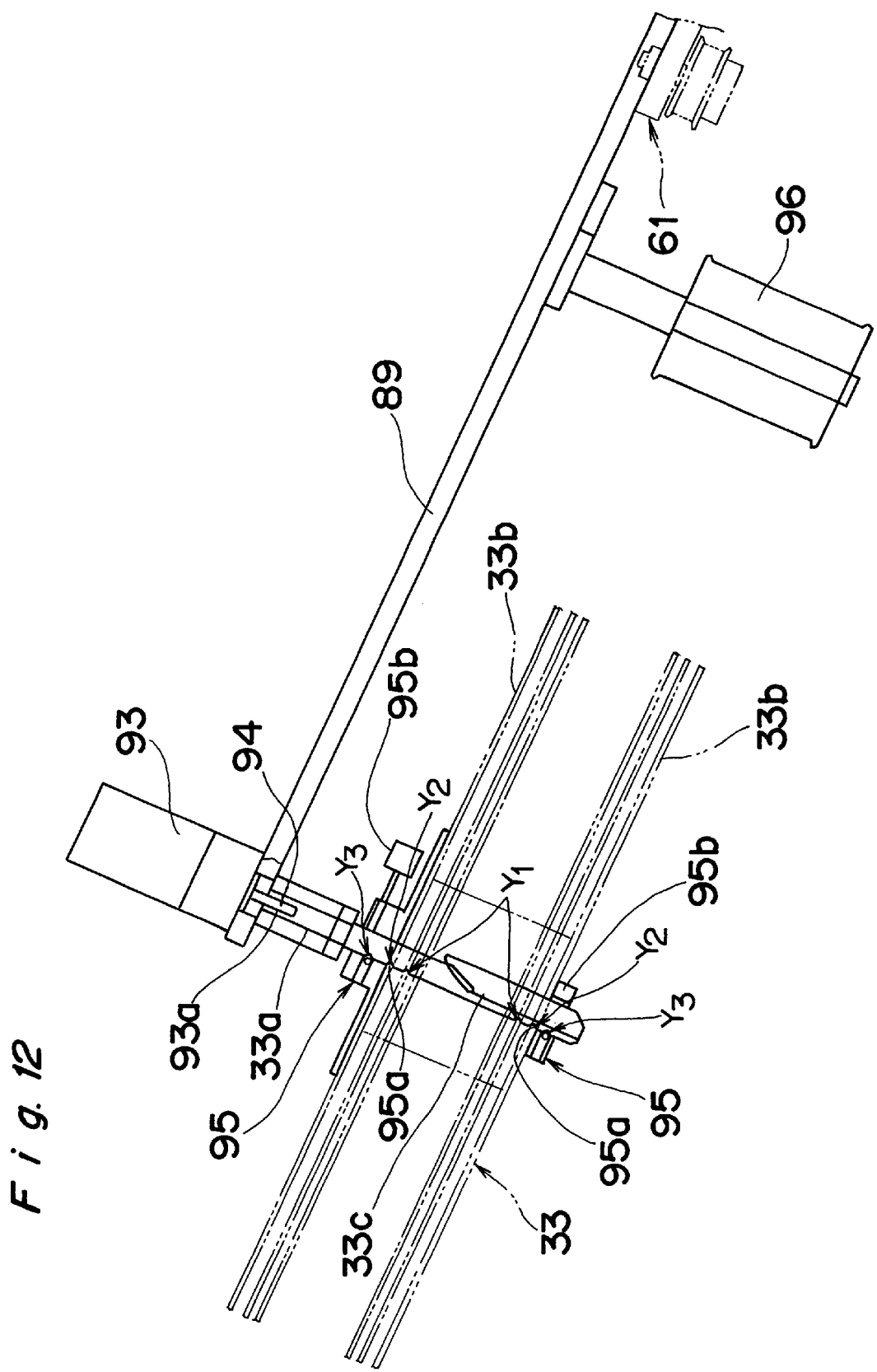
FIG. 12 is a sectional view of the wind-up reel part in the apparatus of FIG. 1.

The feed reel 31 and the wind-up reel 33 are removably fitted to end portions of brackets 88, 89, as shown in FIGS. 1, 11 and 12, whose base portions are fitted to the base 61. For this fitting, the end portion of the bracket 88 is provided with a brake shaft 91 where a keeper 86 having braking function is put into operation as shown in FIG. 11. A rotating shaft 31a of the feed reel 31 is fitted to the brake shaft 91 and fixed by a screw 92, so that the component holder 3 reeled out from the feed reel 31 by the conveyor means 43 is kept in a certain tensional state by the function of the keeper 86 so as not to be loosened. Further, a motor 93 is provided at the end of the bracket 89 as shown in FIG. 12. A rotating shaft 33a of the wind-up reel 33 is fitted to a shaft 93a of the motor 93 and fixed by a screw 94, in which arrangement the motor 93 is driven in synchronization with the motor 48 for the conveyor means 43 so that the taped components 32 conveyed by the conveyor means 43 and then taped are wound up without any difficulties while being kept in a certain tensional state. Guide rollers 96 are provided near the fitting base portions of the brackets 88 and 89 so that the component holder 3 and the taped components 32 are guided between the feed reel 31 and the conveyor means 43 and between the conveyor means 43 and the wind-up reel 33.

Figure 5:
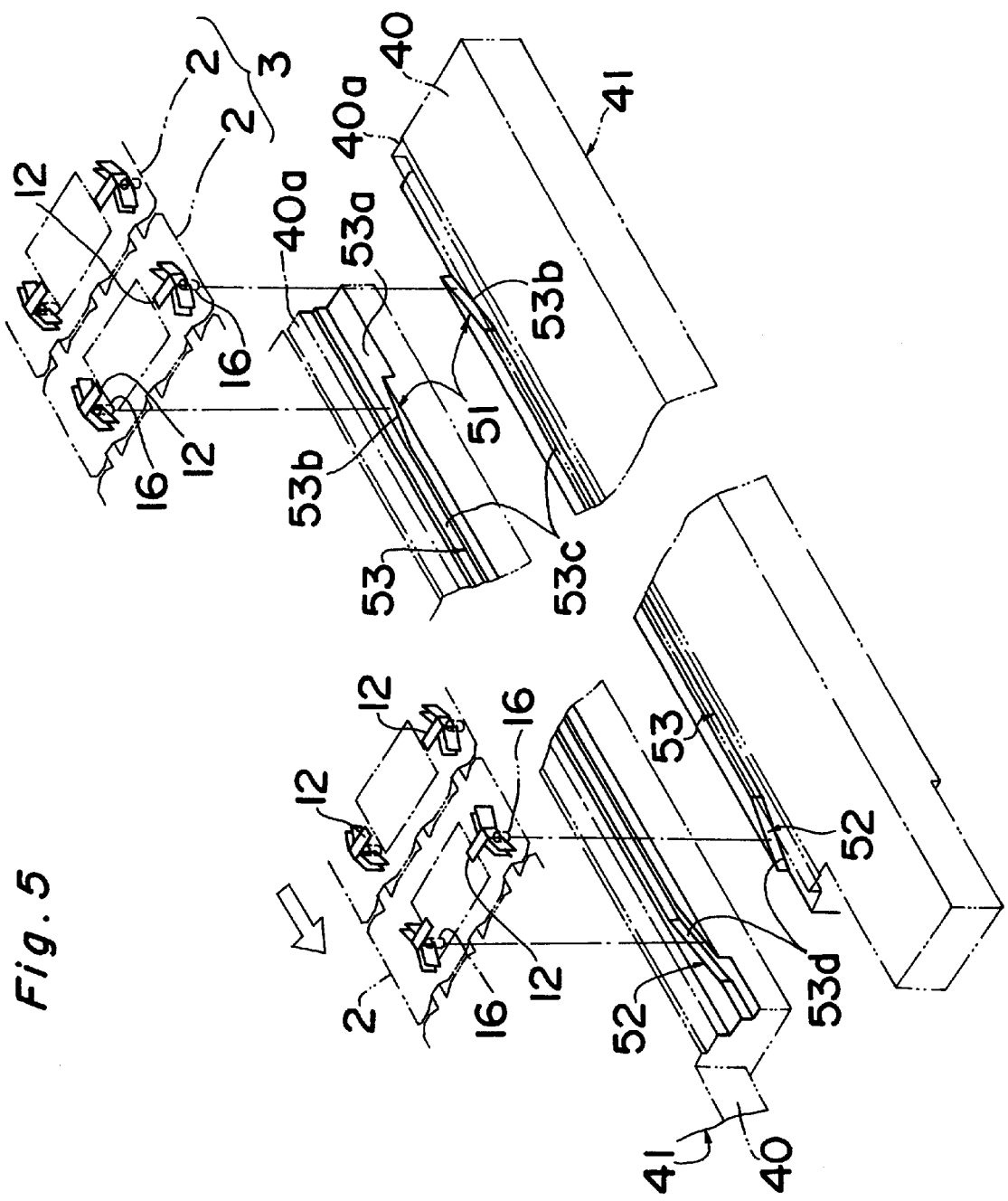
FIG. 5 is a perspective view showing guide means and shutter opening/closing means in the apparatus of FIG. 1.
Figure 8:
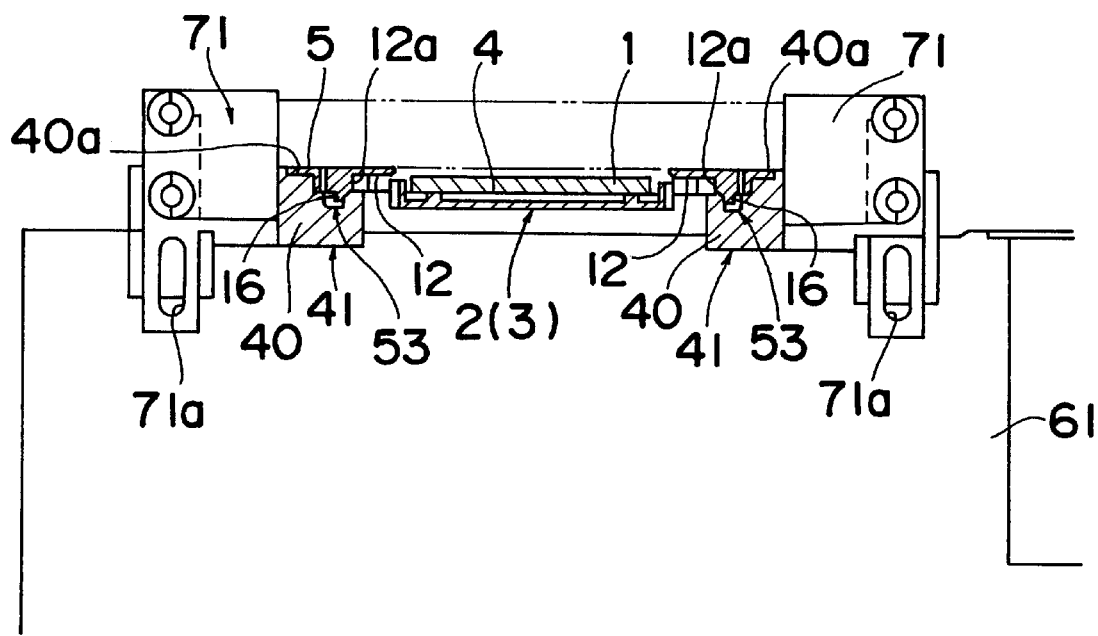
FIG. 8 is a transverse sectional view of a portion where the incomplete-storage sensor is mounted in the apparatus of FIG. 1.
Figure 9:
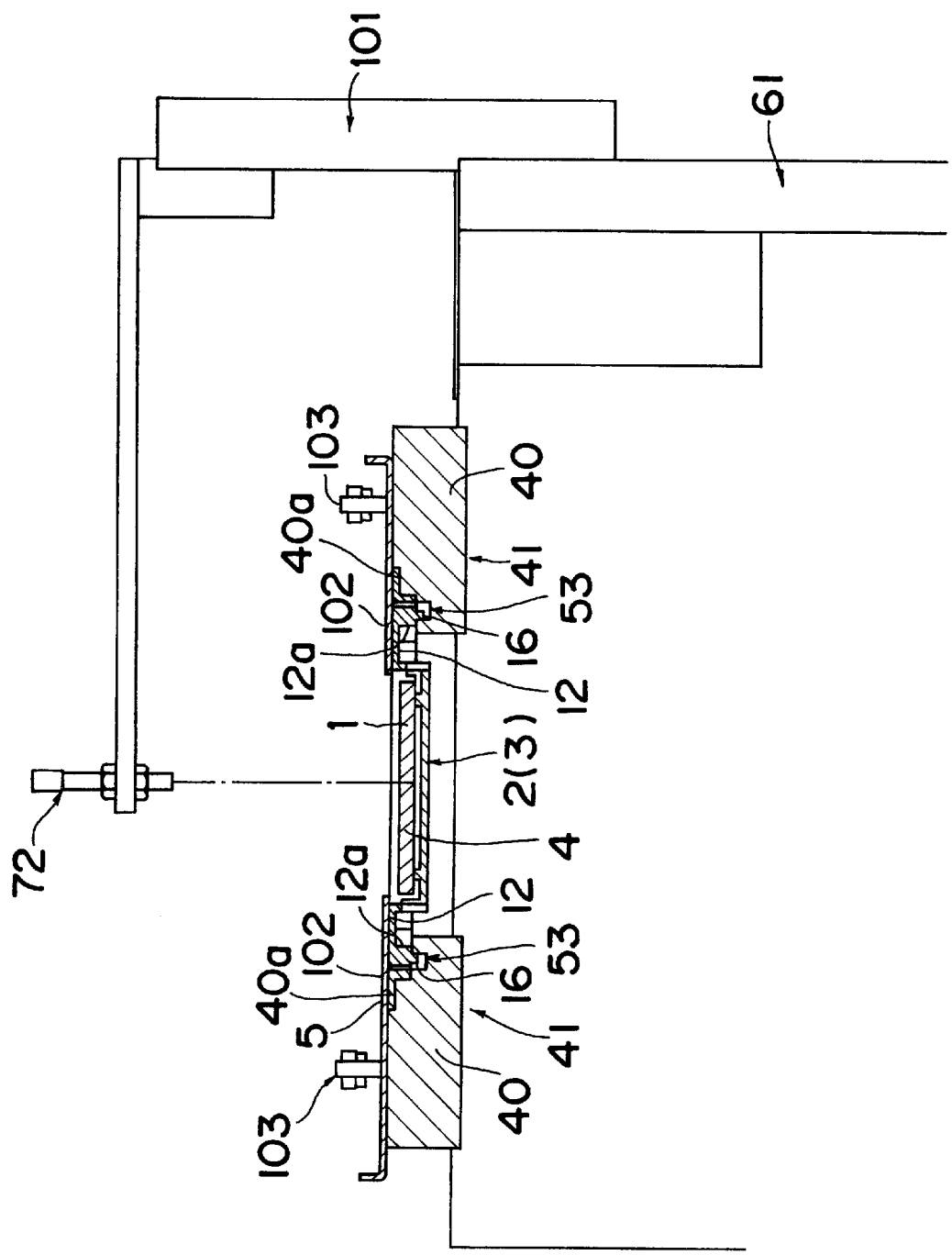
FIG. 9 is a transverse sectional view of a portion where the nonstorage sensor is mounted in the apparatus of FIG. 1.
Figure 10:
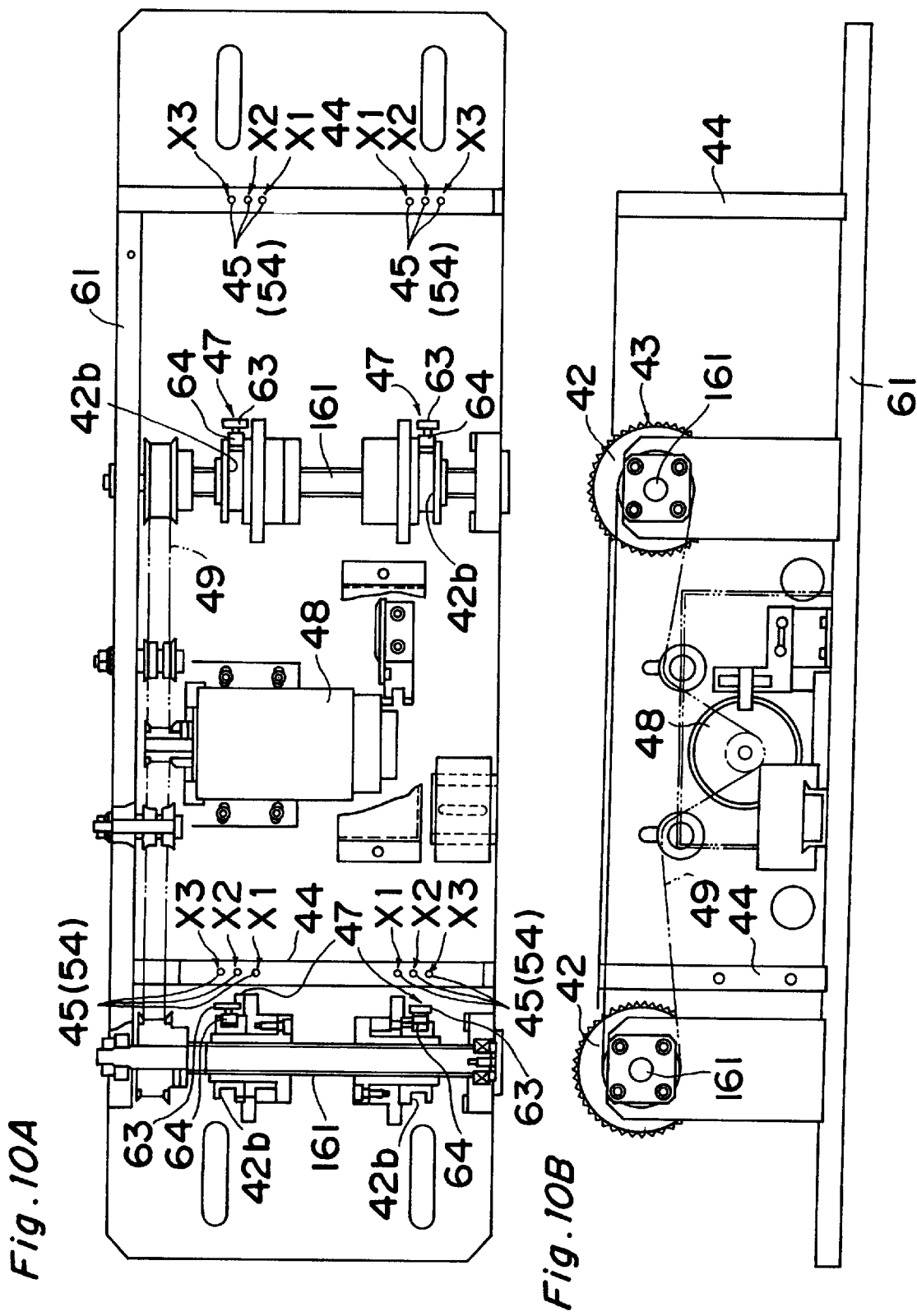
FIGS. 10A, 10B show a drive system for the conveyor means in the apparatus of FIG. 1, where

Also, the guide rails 40 constituting the guide means 41 each comprise (based on the fact that the component holder 3 employed in this embodiment has the shutters 12 in its component storages 4) a shutter opening means 51 serving as one example of the shutter opening device which moves the shutter 12 that is located in the projectional position of each component storage 4 of the component holder 3 on the upstream side of the component-storage working position as shown in FIG. 5 to the retreat position so as to open the shutters. The guide rails also comprises a shutter closing means 52 serving as one example of the shutter closing device which moves the shutter 12 of each component storage compartment 4 of the component holder 3 from the retreat position to the projectional position and closes it on the downstream side of the component-storage working position. These shutter opening means 51 and shutter closing means 52 are formed by guide grooves 53, as shown in FIGS. 5 to 9, which receive the lateral protrusions 16 extending downward from the base portions of the shutters 12 in the stepped-down surfaces 40a of the guide rails 40. As seen in FIGS. 8 and 9, the lateral protrusions 16 extend downward from the shutters 12 at lateral sides of each component storage compartment 4 (as opposed to the front and rear sides which adjoin adjacent holder units 2).

Figure 6A:
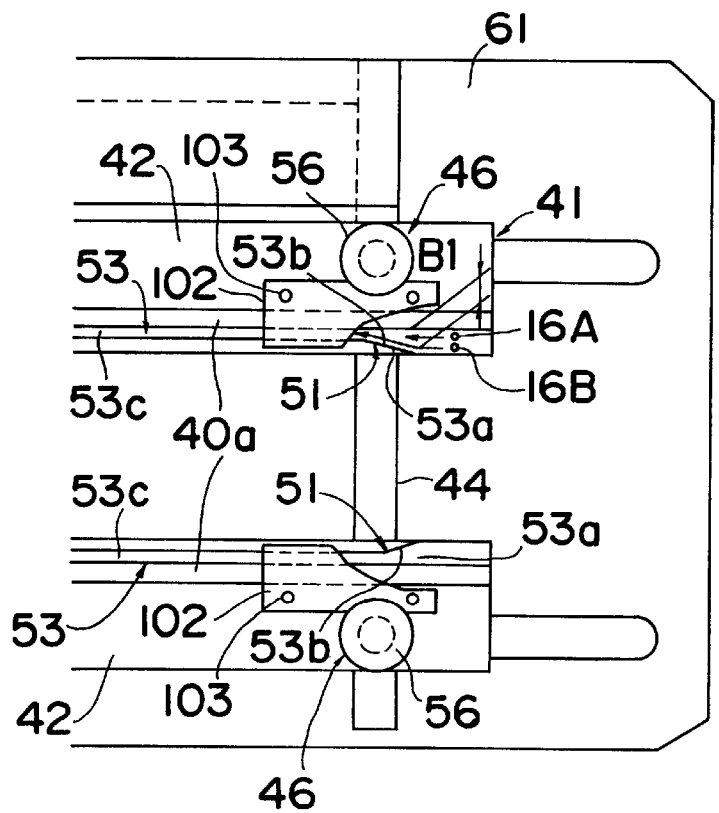
FIGS. 6A, 6B show an upstream side end portion of the guide means in the conveyance direction in the apparatus of FIG. 1, where
Figure 6B:
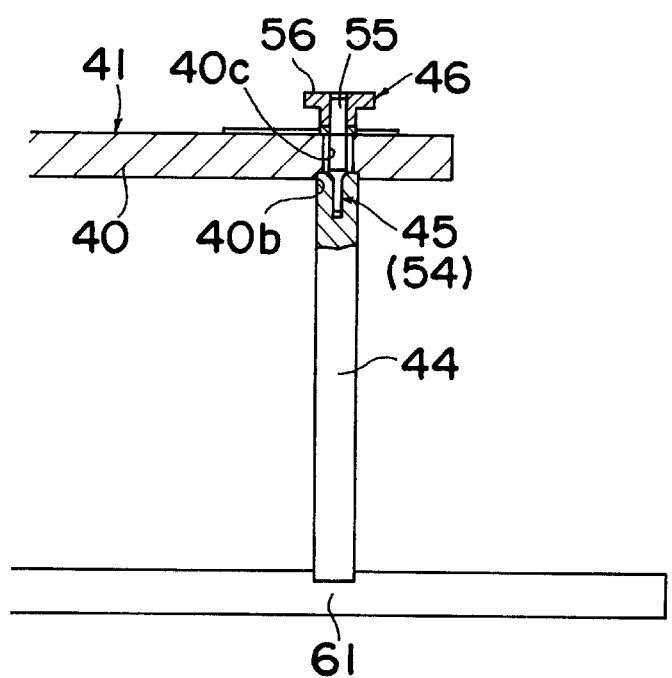

The upstream end of each guide groove 53, as shown in FIGS. 5 and 6A/6B, is formed into a receiver hole 53a having a groove width B1 capable of receiving the protrusion 16 provided at the base portion of the shutter 12, whichever the shutter 12 of each component storage 4 of the conveyed component holder 3 is located in the projectional position or in the retreat position. The shutter opening means 51 comprises a cam surface 53b which is inclined so that a protrusion 16A shown in FIG. 6A corresponding to the shutter 12 that is located in the retreat position and that enters the guide groove 53 from the receiver hole 53a is advanced, as it is, along with the conveyance of the component holder 3, and so that a protrusion 16B shown in FIG. 6A corresponding to the shutter 12 that is located in the projectional position is advanced so as to be moved outward up to the position of the protrusion 16A. Thus, the shutter opening means 51 advances the shutter 12 located in the retreat position as it is, while the shutter opening means 51 advances the shutter 12 located in the projectional position while moving it to the retreat position.

Accordingly, even when the component holder 3 is unused so that all the shutters 12 are opened in the retreat positions, there occur no problems. In addition, even if the component holder 3 is reused so that all the shutters 12 are closed in the projectional positions or so that some of the shutters 12 are closed in the projectional positions as shown by the component holders 3 located upstream of the shutter opening means 51 of FIG. 2 while the others of the shutters 12 are opened in the retreat position, both cases can be managed. As a result, it is possible to obtain a state in which all the shutters 12 are opened in the retreat positions as shown by the component holders 3 located downstream of the shutter opening means 51 of FIG. 2. Thus, the electronic components 1 or the like can be stored reliably without omissions in the individual component storages 4 that are conveyed at the component-storage working position 134 between the shutter opening means 51 and the shutter closing means 52. However, with the cam surface 53b provided, the shutter opening means 51 and the shutter closing means 52 do not necessarily need to be grooves. Also, when the component holder 3 is unused so that all the shutters 12 are surely located in the retreat positions, or when the apparatus is designed for such a special use, the shutter opening means 51 is not essential.

Each of the guide grooves 53, as shown in FIGS. 5 and 6A/6B, has a linear portion 53c as shown in FIG. 5 formed in a range from a portion forming the shutter opening means 51 to a portion forming the shutter closing means 52, so that the guide groove 53 holds the protrusion 16 at the position of the protrusion 16A corresponding to the retreat position of the shutter 12. Consequently, the shutter 12 is prevented from being unexpectedly moved to the projectional position within the range of the component-storage working position set as described before. However, this is not essential either, and the guide grooves 53 may be omitted between the shutter opening means 51 and the shutter closing means 52.

Figure 7A:
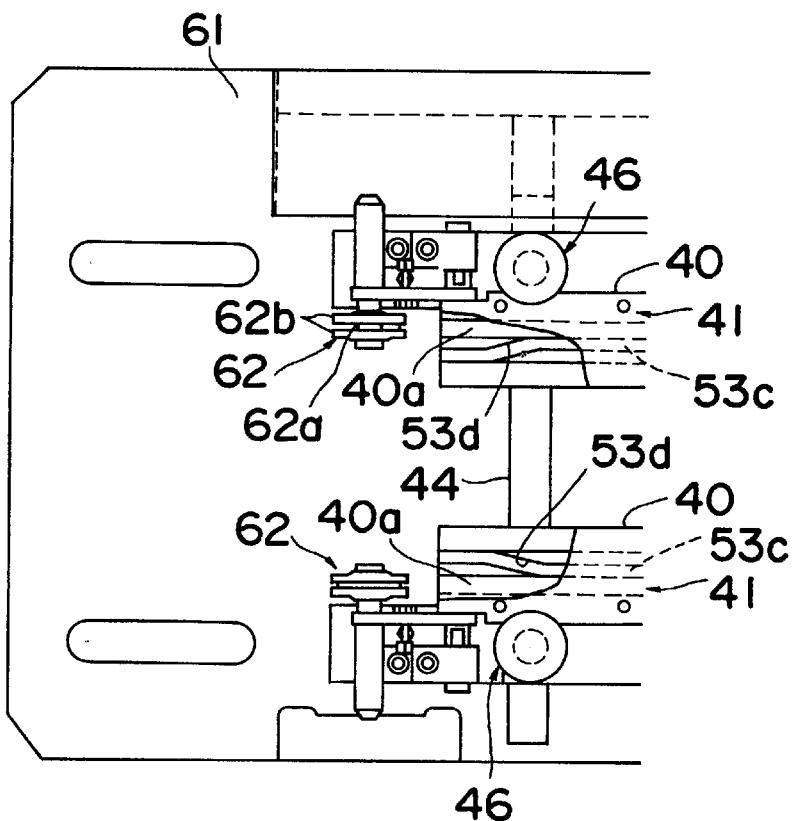
FIGS. 7A, 7B show a downstream side end portion of the guide means in the conveyance direction in the apparatus of FIG. 1, where
Figure 7B:
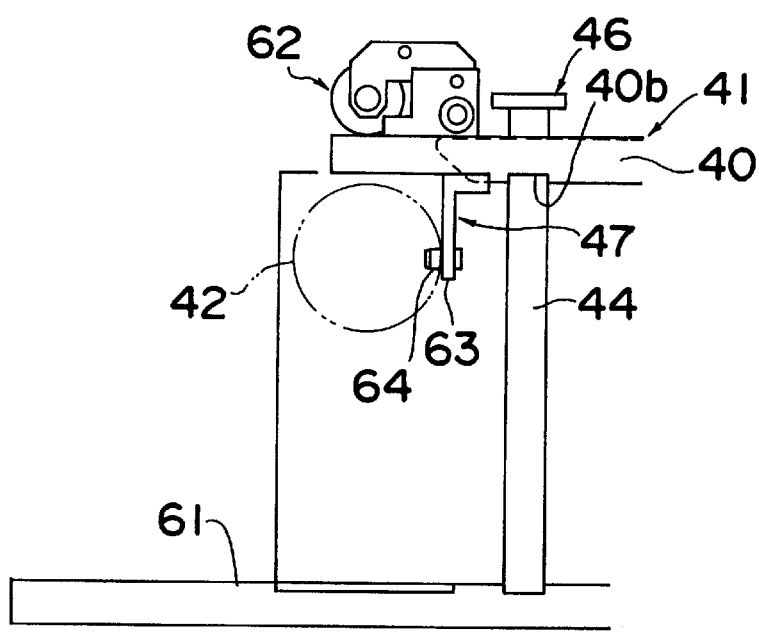

As shown in FIGS. 5 and 7A/7B, the shutter closing means 52 has, in a portion adjoining the linear portion 53c of the guide groove 53, a cam surface 53d which moves the protrusion 16 (which had been maintained in the position of the protrusion 16B corresponding to the retreat position of the shutter 12) inwardly up to the position of the protrusion 16A corresponding to the projectional position of the shutter 12 as the component storage 4 is conveyed. In this position, all the shutters 12 of each component storage 4 conveyed up with the electronic components 1 or the like stored therein are automatically moved to the projectional position and closed. Thus, the stored electronic components 1 or the like can be reliably prevented from falling out.

As shown above, the shutter opening means 51 as well as the guide means 41 equipped with the shutter opening means 51 for automatically taping the components by using the component holder 3 having the shutters 12 in the component storages 4 do not become so complex in construction. In addition, the shutter opening means 51 and the shutter closing means 52 are integrated with the guide rails 40 so that they are positioned at positions corresponding to the widths of the component holders 3 involved case by case without any special mechanism or work, thus producing an advantage that no errors of positional precision occur. Although the portion of the cam surface 53d is also formed into a groove in this embodiment, this is not always necessary and it is only required to provide the cam surface 53c. Further, the shutter opening means 51 and the shutter closing means 52 may be of any construction and, in some cases, it may be operated by hand or by an actuator. With these aspects of the embodiment, the operation part for movement of the shutter 12 between the two positions may be provided in a form other than the protrusion 16 as shown above.

With regard to the right-and-left guide rails 40, grooves 40b provided at an upstream-side end portion and a downstream-side end portion in their conveyance direction are slidably fitted to an upper end portion of the plateshaped support member 44 directed perpendicular to the conveyance direction, so that the guide rails 40 can be moved independently of each other through the sliding operation to a plurality of particular positions X1 to X3 corresponding to the widths of various component holders 3 while being kept in a constant position in the conveyance direction. The positioning portion 45 provided at each of the particular positions X1 to X3 is implemented by a screw hole 54. The positioning and holding means 46 comprises a positioning pin 55 which can be inserted without clearance into a fitting hole 40c corresponding to the screw hole 54 provided at the upper end portion of the support member 44 for the guide rails 40 and which has a screw portion to be screwed into the screw hole 54, and a nut 56 which is screwed to the screw portion projected upward of the fitting hole 40c of the positioning pin 55 so as to fixedly tighten the guide rail 40 to the fitting position with the positioning pin 55.

With this arrangement, after one of the particular positions (holes X1 to X3) is selected and the positioning pin 55 is screwed into the screw hole 54 provided in the selected position, the fitting hole 40c of the guide rail 40 is fitted to the positioning pin 55. Thus, the guide rail 40 can be correctly positioned to the one position selected out of the particular positions X1 to X3, while the guide rail 40 can be tightened and held in the positioning position by screwing the nut 56 to the screw portion of the positioning pin 55. However, the same functional effects can also be obtained by previously forming the positioning pin 55 and the nut 56 integrally with each other. In addition, the positioning structure and the holding structure for the guide rail 40 to the positioning position may be separated from each other. For example, an arrangement may be adopted in which a positioning hole and a protrusion which are fitted to each other between the guide rail. 40 and the support member 44 to thereby attain the positioning are provided, while a positioning and holding means 46 such as a screw for fixedly tightening the guide rail 40 to a positioned state with a tightening stroke larger than the fitting margin of the positioning hole and the protrusion is separately provided. Moreover, a play in a direction perpendicular to the conveyance direction, i.e., in the direction of positional adjustment of the guide rail 40, is provided by an elongated hole (two positions are defined by both ends of the elongate hole) or the like between the positioning and holding means 46 and the guide rail 40. In this arrangement, the guide rail 40 can be re-positioned to a specified position in a state in which the tightening by the positioning and holding means 46 is released to a degree of the stroke, and afterwards the tightening by the positioning and holding means 46 is effected. In this case, there are no members that should be removed in a replacement of the guide rail 40 so that the work becomes easier to carry out.

The sprockets 42 are provided in such a way, as shown in FIG. 10A, that an upstream pair of sprockets and a downstream pair of sprockets in the conveyance direction, both of which are opposed to each other right and left, are fitted to a spline shaft 161 supported by the base 61 together with the support member 44 and the motor 48 so as to be movable in the axial direction and integrally rotatable in the rotational direction. Thus, rotation from the motor 48 is transferred to the individual sprockets 42 via the belt 49 and the spline shaft 161, so s to enable the conveyance of component holders 3. Then, the linkage means 47 comprises a follower 64 shaft-supported to a bracket 63 attached to the lower surface of the guide rail 40 as shown in FIGS. 7A/7B and 10A/10B, and an annular groove 42b of the sprocket 42 to which the follower 64 is fitted. The sprockets 42 follow, on the spline shaft 61, the movement of the follower 64 when the guide rail 40 is moved so as to be positioned at any of the positions X1 to X3 in the direction perpendicular to the conveyance direction as described above, by which the sprockets 42 are automatically positioned at a position corresponding to the positioning of the guide rail 40 on a corresponding side. The constitution of such linkage means 47 is also not limited to that of this embodiment, and may be designed into various types of concrete structures within the scope in which the same functions can be exerted.

Each position where the sprocket 42 is fitted to the feed hole 11 of the component holder 3 is a portion where the guide rail 40 is absent, and a presser roller 62 is installed to replace the absent portion of the guide rail 40 nearby the position. The presser roller 62 presses the right-and-left edge portions of the flange 5 of the component holder 3 by flanges 62b on both sides of an annular groove 62a in a state in which the press roller 62 has escaped from pins 42a of the sprocket 42 in the annular groove 62a, where the feed holes 11 are positively engaged with the pins 42a of the sprocket 42 so that the component holder 3 is conveyed with high precision without any changes in it position or speed.

Further, the feed reel 31 and the wind-up reel 33 have reel flanges 31b, 33b which can be moved in the axial direction along keys 31c, 33c for rotation lock on their corresponding rotating shafts 31a, 33a as shown in FIGS. 11 and 12. Also, there are provided click stoppers 95, serving as one example of the reel flange-positioning device, which elastically fit the reel flanges 31b, 33b to a plurality of particular positions Y1 to Y3 corresponding to the widths of component holders 3 involved case by case. As a result, the feed reel 31 and wind-up reel 33 can also be correctly moved spontaneously to required positions by selecting elastic engaging positions where the click stoppers 95 are engaged with engaging recesses 95a provided on the rotating shafts 31a, 33a in the particular positions Y1 to Y3 and corresponding to the widths of various component holders 3, with a light move against the elastic fitting force of the click stoppers 95 and click as well as click feeling that occur at the time of elastic fitting of the click stoppers 95. Thereafter, the click stoppers 95 are fixed by screws 95b. That is, as shown in FIG. 19, balls 95d, 95f are respectively urged by urging forces of springs 95c, 95e in the ball plungers of the click stoppers 95 so as to engage into an individual engaging recess 95a selected from the engaging recesses 95a provided on the rotating shafts 31a, 33a. After the balls 95d, 95f are respectively engaged into one of the individual engaging recesses 95a on the rotating shafts 31a, 33a, screws 95b are rotated to contact and press against the surfaces of the rotating shafts 31a, 33a to prevent the feed reel 31 and wind-up reel 33 from unintentionally moving. On the other hand, when the feed reel 31 and wind-up reel 33 are intentionally moved, the screws 95b are loosened, and then the feed reel 31 and wind-up reel 33 can be moved and clicked and stopped with the ball plunges of the click stoppers 95 as described above. Reference numeral 191 denotes a bearing. Although the click stopper 95 of this embodiment employs a ball plunger, it may also employ a plate spring or other elastic engaging member.

In addition, the guide roller 96 is fittable to the maximum width of the component holder 3.

Between the component-storage working position in the conveyance path of the component holders 3 formed by the guide means 41 and the shutter closing position where the shutter closing means 52 is provided, there are provided an incomplete-storage sensor 71 as shown in FIGS. 1, 4 and 8 for detecting an incomplete-storage state of the electronic components 1 or the like stored in the component storages 4, and a non-storage sensor 72 as shown in FIGS. 1, 4 and 9 for detecting a non-storage of the electronic components 1 or the like of the component storages 4. The conveyor means 43 is controlled so as to be stopped when at least one of an incomplete-storage signal or a non-storage signal derived from the incomplete-storage sensor 71 and the non-storage sensor 72 is present.

With this arrangement, after the individual component storing sections 4 pass through the component-storage working position, upon occurrence of either an incomplete-storage state in which an electronic component 1 or the like is incompletely stored in the component storage 4, floated or partly projected, or a non-storage in which that an electronic component 1 or the like is not stored due to any reason, the incomplete-storage sensor 71 or the non-storage sensor 72 detects the state(s) before the component storage reaches the shutter closing position. If at least one of the incomplete-storage signal and the non-storage signal is present, the conveyor means is stopped. Therefore, taking advantage of the fact that the shutter 12 is opened in the retreat position in the component storage 4 that has been detected for the incomplete storage or non-storage, measures can be taken such as putting the incompletely stored component into a specified stored state or storing the component which has not been stored. Moreover, there can be prevented such possibilities that, with the component floated or partly projected, the shutter is moved to the projectional position and resultantly damaged, or that the component is popped out or the popped-out component bites into the parts of the apparatus, incurring trouble.

The incomplete-storage sensor 71 is provided so as to have a sensing optical path ranging from the top-surface height position of the component holder 3 positioned at the stepped-down surface 40a of the guide rail 40, or a position near this position, to an upper specified height as shown in FIG. 8. If the electronic component 1 or the like stored in the component storage 4 of the component holder 3 is even slightly floated or partly projected from the component storage 4, a shading occurs to the sensing light, allowing the incomplete-storage state to be detected by electrically detecting this shading of sensing light. Preferably, the incomplete-storage sensor 71 is mounted so as to be adjustable in height, for example, by forming a mounting hole 71a into an elongated hole so that the detection can be correctly achieved. However, the type and installation state of the sensor used may be changed in various ways.

Also, the non-storage sensor 72 is supported above a widthwise central position of the conveyance path for the component holder 3 by a bracket 101 fitted to the base 61 as shown in FIG. 9. Sensing light is projected from above to the conveyed component holder 3 so that the state of resulting reflected light is electrically detected, thereby detecting a non-storage state of the electronic component 1 or the like. For this detection, taking advantage of the fact that the conveyance of the component holder 3 is intermittently effected for the storage of the electronic component 1 or the like and that each component storage 4 is stopped one by one in a certain position, the non-storage sensor 72 is provided in association with a specified position where each component storage 4 is stopped. However, the non-storage sensor 72 may also be implemented in any form and installed in various ways according to the adopted form.

Also, a presser plate 102 for pressing the component holder 3 is provided and fixed by screws 103 or the like both at a position where the shutter opening means 51 and the shutter closing means 52 of the guide rail 40 are provided, and before and after the provision of the incomplete-storage sensor 71. As a result of this, the component holder 3 can be prevented from escaping when the shutter 12 is opened and closed by operating the protrusion 16. Moreover, the component holder 3 can be prevented from floating due to some reason in the detecting position of the incomplete-storage sensor 71 and misdetected as an incomplete-storage state.

The motor 48 for the conveyor means 43 and the motor 93 for the wind-up reel 33 are controlled by control means 111 using a microcomputer or the like as shown in FIG. 1. A leader portion 3a of the component holder 3 having no component storages 4 is drawn out from the feed reel 31, passed along the guide rails 40, and initially wound around the wind-up reel 33, where component storage is ready. Then, the conveyance of the component holder 3 is started by operation of a start key 113 of an operation panel 112 or an unshown foot switch. The synchronous drive of the motors 48, 93 is controlled so as to be thrown into a set speed relation while their rotational states are being detected. The conveyance is intermittently effected with set intervals, so that each time the component holder 3 is stopped, a electronic component 1 or the like is stored in a component storage 4.

In addition, in the case where the electronic component 1 or the like is stored by manual work, it is preferable to iterate the steps of effecting the start operation so that the component holder 3 is conveyed a specified amount and afterwards automatically stopped so that the electronic component 1 is placed in the component storage 4, and then effecting another start operation so that the component holder 3 is again conveyed the specified amount and afterwards automatically stopped. In these operations the operator is able to iterate the conveyance of the component holders 3 to keep up with the operator's storage work, by which the electronic components 1 or the like are taped on and on, which is easier work for the operator.

Although the control means 111 automatically continues the intermittent conveyance, the control means 111, upon reception of detection signals from the incomplete-storage sensor 71 and the non-storage sensor 72, also stops the conveyance on condition that at least one of the incomplete-storage signal and the non-storage signal is present. Furthermore, the control means 111 can also stop the conveyance anytime by an operation of a stop key 114 of the operation panel 112. This arrangement makes it possible to cope with emergencies.

Further, in the operation panel 112, a setting means 115 for setting a one-time feed number of component storages 4 (i.e., the number of component storages 4 that are made available for component storage at one stop through the intermittent conveyance of the component holder 3 by the conveyor means 43) is provided as a plurality of keys or the like. The control means 111 is so arranged as to drive the conveyor means 43 in steps of a pitch corresponding to the one-time feed number of component storages 4 set by the setting means 115 in response to each-time conveyance of the component holder 3.

As a result of this, electronic components 1 or the like can be stored into the set number of component storages 4 simultaneously or sequentially at a one-time stop by the robot 81 or the like, thus allowing the efficiency of component storage to be improved. Such a way of storage can be implemented also by manual work.

In this case, when the number of component storages 4 equipped in the component holder 3 used is indivisible by the set one-time feed number of component storages 4, the control means 111 drives the conveyor means 43 at the last-time conveyance of the component holder 3 by a pitch corresponding to the indivisible odd number of component storages 4. By doing so, the component holder 3 can be prevented from being conveyed uselessly.

When the taped components 32 after the taping are completely wound up around the wind-up reel 33, the emptied feed reel 31 is removed and replaced with the next feed reel 31 around which the component holder 3 has been wound up, and the wind-up reel 33 that has been completely wound up is removed and replaced with an empty wind-up reel 33. Then, the next component taping process is started.

Figure 16:
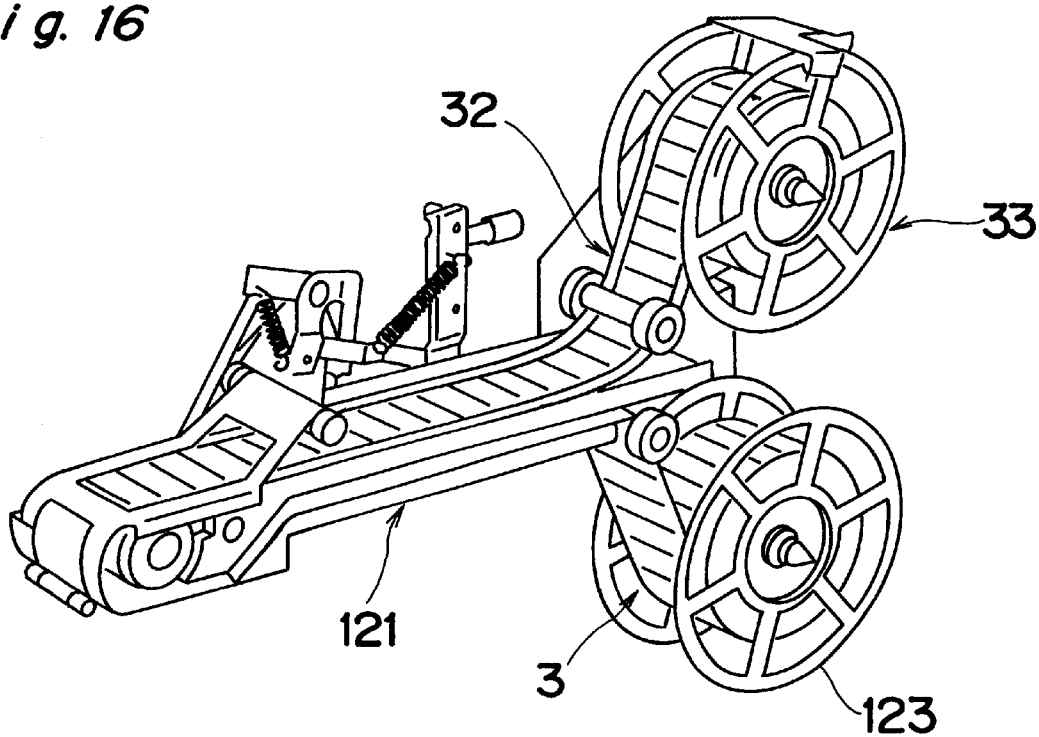
Figure 17:
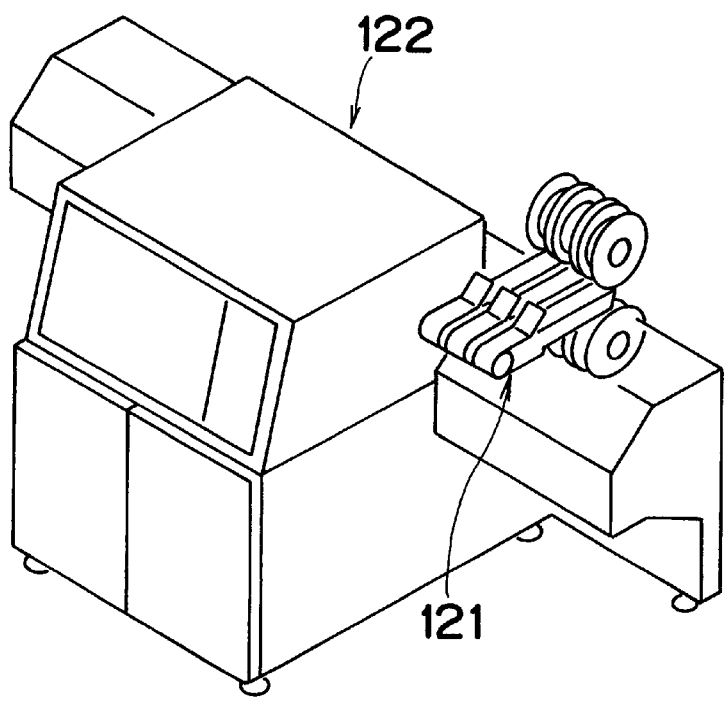
FIG. 17 is a perspective view of a mounter which uses the component feed cassette of FIG. 16.
Figure 18:
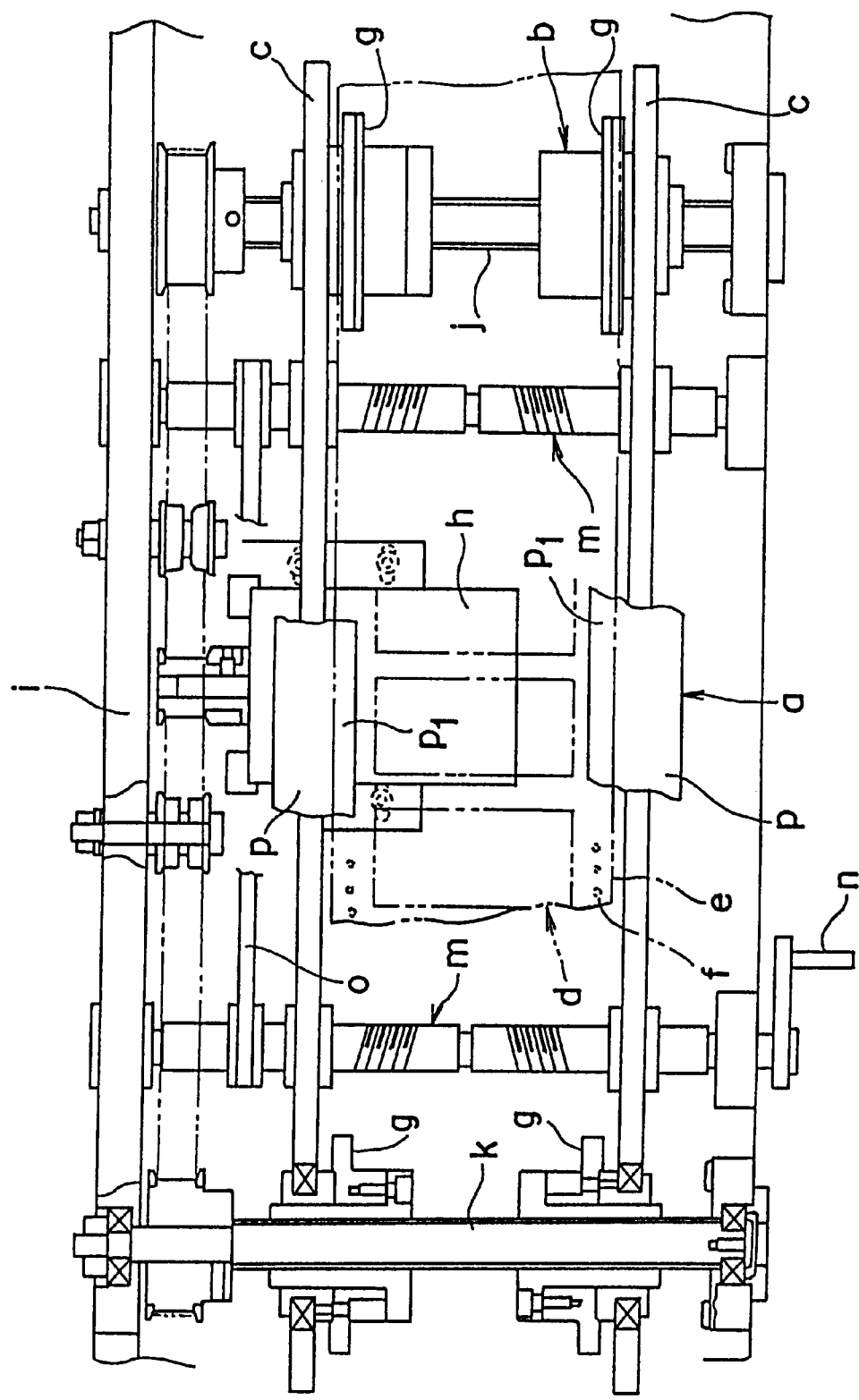
FIG. 18 is a plan view of guide means and conveyor means in a component taping apparatus according to the prior art.

The wind-up reel 33 on which the taped components 32 have completely been wound up is fitted to a component feed cassette 121 as shown in FIG. 16, and put into practical use in a component mounter 122 or the like for producing electronic circuit boards by mounting the electronic components 1 onto a circuit board as shown in FIG. 17. In the component mounter 122, each time electronic components 1 are required, the component storages 4 (in which the electronic components 1 in the form of taped components 32 have been stored) are moved one by one to the component feed position while the shutters 12 are opened, and the electronic components 1 are taken out by a pickup nozzle or the like and used. The component holder 3 after the electronic components 1 have been taken out are wound up around a reel 123. While the reel that has completely wound up the component holder 3 is used as the feed reel 31, the component holder 3 dealing with the electronic components 1 is subject to cleaning, and is not immediately being used as the feed reel 31.

Moreover, the embodiment has the following advantages as compared with the conventional technique.

In the conventional technique, in order to store components into a component holder unit, the shutters should be retreated from the projectional positions and, thus, the shutters are moved to the retreat positions by an external force. That is, if such unstable shutters are used that the shutters utilize their elastic deformations to move from the projectional positions to the retreat positions, the shutters can not be stably positioned at the retreat positions. Thus, external forces should always be applied to the shutters during a required time to keep their opening states when the shutters are located at the retreat positions due to their elastic deformations. If the shutters are driven by, for example, such a retreat mechanism that protrusions projected from the shutters are guided along the guide grooves (for example, guide grooves 53 in FIG. 5) to move the shutters to the retreat positions, the width of the opening of the shutters depends on the precision and configuration of the guide grooves, thus making it difficult to obtain a desired opening between the shutters depending on precision and configuration of the guide grooves. Furthermore, since the protrusions. always contact the walls of the guide grooves, the protrusions are worn away to unfavorably change the dimension of the opening between the shutters.

On the other hand, according to the present embodiment, since the shutters 12 are stably positioned at the retreat positions, the protrusions 16 are used only when the shutters 12 are moved so as to be opened and closed, and it is unnecessary to hold the protrusions 16 so as to position the shutters 12 at the projectional positions and retreat positions. Since the protrusions 16 do not always contact any member except for the movement of the shutters 12 between the projectional positions and retreat positions, the protrusions 16 are hardly worn away. Additionally, the shutters 12 are stably located at the projectional positions and retreat positions with more than a sufficient level of urging force. Thus, even though the protrusions 16 are worn away, the dimension of the opening between the shutters 12 is not changed. Since the protrusions 16 basically do not contact the walls of the guide grooves 53, the dimension of the guide grooves 53 has no effect on the movement of the protrusions 16.

As shown in FIG. 3, when the component 1 etc. supplied by the pallet 82 is stored into the component holders 3 by the robot 81, the plural components 1 are simultaneously or sequentially picked up by plural pick-up nozzles of the robot 81. Then, the robot 81 is moved to the componentstorage working position. Thereafter, the plural components 1 picked up by the plural pick-up nozzles of the robot 81 are simultaneously or sequentially stored into the component holders 3 to reduce a time required for component storing work, specifically, a time for moving the robot 81 to the componentstorage working position.

Additionally, when the components 1 supplied by the pallet 82 are stored into the component holders 3 by the robot 81, and a number of component storages equipped in the component holder is indivisible by the set one-time feed number of component storages, the conveyor device is driven at the last-time conveyance of the component holder by a pitch corresponding to the indivisible odd number of component storages. Thus, it can prevent the components from being stored into more than a required number of the component holders in advance. In addition, a necessary number of component storages (i.e., only the indivisible odd number of component storages) can be performed.

In the embodiment, the control means 111 stops the conveyor means when at least one of the incomplete-storage signal and a non-storage signal derived from the incompletestorage sensor and the component sensor is present. The present invention is not limited to this, and when the incomplete-storage signal derived from the incomplete-storage sensor is present, the control means may stop the conveyor means. Also, when the non-storage signal derived from the component sensor is present, the control means 111 may generate a warning.

According to the component taping method of the invention, while the component holder having a multiplicity of component storages longitudinally is handled and conveyed without disturbances, the components are stored and stabilized one after another without any disturbance of the shutters that prevents the components stored in the component storages from falling off, and for the component storages that have stored the components therein, the shutters are forcedly closed so that the stored components are held in the stored state. Therefore, components can be taped on and on into such a state that stored components can be reliably prevented from falling out. Besides, the taped components after the taping are wound up around the reel, so that the components become easier to handle afterwards. Moreover, it becomes more likely to avoid such a possibility that the shutters are unexpectedly moved to the retreat positions under some external force during various types of handling before the feeding of components so that the components may fall off or come to a falling-off state. As a result, mis-storage or mis-holding of components are unlikely to occur on the way from taping to component feed.

According to the component taping apparatus of the invention, a taping performance which is reliable in component holding without relying on the restoring force of the shutter and which is unlikely to cause mis-storage and misholding of components can be automatically achieved.

According to the apparatus of the invention, in particular, even if the component holder is reused so that some shutter has been moved to the projectional position, the shutter is moved to the retreat position and opened before the components are stored in the component storages, so as not to disturb the storing of components, thus preventing occurrences of mis-storage and misholding of components.

According to the apparatus of the invention, in particular, upon occurrence of either an incomplete-storage state or a non-storage state even after the passage of each component storage over the component-storage working position, the conveyor means is stopped before each component storage reaches the shutter closing position. This allows measures to be taken such as putting the incompletely stored component into a stored state or storing the non-stored component by taking advantage of the fact that the shutter is opened in the retreat position in the component storage that has been detected for the incomplete storage or non-storage. Moreover, there can be prevented such possibilities that, with the component floated or partly projected, the shutter is moved to the projectional position and resultantly damaged, or that the component is popped out or the popped-out component bites into the parts of the apparatus, causing trouble.

According to the component taping apparatus of the invention, in the operation that while the component holder is longitudinally guided by the guide means and conveyed by the conveyor means, the components are stored in its component storages and automatically taped, the right-and-left guide means can be fixed with simplicity and correctly at positions matching the particular component holder involved. At the same time, since the right-and-left sprockets of the conveyor means are positioned correctly at the positions matching the width of the component holder involved, in linkage with their corresponding right or left guide means, the component holder can be guided and conveyed with high precision. Therefore, occurrence of mis-storage or mis-holding of components can be prevented from taking place due to unstable guidance or conveyance of the component holder. Moreover, the right-and-left guide means have no relation to each other and are of such a simple structure as to be only linked with the sprockets on their corresponding side of the conveyor means. Thus, the apparatus cost is reduced as compared with the conventional apparatus.

According to the component taping apparatus of the invention, both the feed reel and the wind-up reel can be instantaneously moved correctly to their required positions, by selecting the elastic engaging positions of the click stoppers provided at particular positions corresponding to the widths of various types of component storages on their rotating shafts, by virtue of alight movement against the elastic engaging force of the click stoppers as well as the sound and feeling at the time of an elastic engagement of the click stoppers.

The entire disclosure of Japanese Patent Application No. 96350 filed on Jan. 17, 1997, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component storage method comprising:

winding a component holder around a storage reel, the component holder having a plurality of component storage compartments arranged along a longitudinal axis of the component holder, each of the component storage compartments having an opening for storing a component therein and having a shutter operable to move between a stable projection position, whereat the shutter is projected into the opening so as to hold the component to be stored in the opening, and a stable retreat position, whereat the shutter is withdrawn from the opening so as to free the component to be stored in the opening, the shutter having a protrusion extending downward from a base of the shutter at a lateral side of each of the component storage compartments, wherein the shutter is operable to move between the projection position and the retreat position by applying an urging force to the protrusion of the shutter;

unreeling the component holder from the storage reel so that the opening of each of the component storage compartments is facing upward;

conveying each of the component storage compartments in the component holder unreeled from the storage reel along a conveying direction from an upstream position to a working position, and from the working position to a downstream position;

moving the shutter of each of the component storage compartments to the retreat position by applying the urging force against a tensional resistance of the protrusion of the shutter when each of the component storage compartments is at the upstream position until the shutter is in the retreat position so as to open the shutter;

maintaining the shutter in the retreat position without applying the urging force after the shutter is moved to the retreat position;

placing a component in the opening of each of the component storage compartments at the working position after said moving of the shutter to the retreat position;

detecting an incomplete-storage state of the component placed in the opening of each of the component storage compartments by an incomplete storage sensor located between the working position and the downstream position, and generating an incomplete-storage signal if an incomplete-storage state is detected;

detecting the presence of a component in the opening of each of the component storage compartments by a component presence sensor located between the working position and the downstream position, and generating a non-storage signal if the presence of a component is not detected;

stopping said conveying of each of the component storage compartments of the component holder when at least one of the incomplete-storage signal and the non-storage signal has been generated;

moving the shutter of each of the component storage compartments to the projection position when each of the component storage compartments is at the downstream position so as to close the shutter of each component storage compartment storing a component by conveying each of the component storage compartments of the component holder along the conveying direction; and winding the component holder having the components stored therein around a component storage reel.

2. The method of claim 1, wherein the shutter of each component storage compartment moves between the projection position and the retreat position along a shutter movement direction, the shutter movement direction being perpendicular to the conveying direction.

3. The method of claim 1, wherein said placing of the components in the opening of each of the component storage compartments comprises continuously placing a component in adjacent component storage compartments one after another, and wherein said moving of the shutter of each of the component storage compartments to the projection position comprises continuously moving the shutter of adjacent storage compartments one after another, whereby the components are formed into a continuous tape.

4. The method of claim 1, further comprising pressing the component holder by a presser member at the upstream position and the downstream position so as to prevent movement of the component holder during said moving of the shutter, and so as to prevent the component holder from being mis-positioned during said detecting of an incomplete-storage state.

5. A component taping apparatus comprising:

a component holder having a plurality of component storage compartments arranged along a longitudinal axis of said component holder, each of said component storage compartments having an opening for storing a component therein and having a shutter operable to move between a stable projection position, whereat said shutter is projected into said opening so as to hold the component to be stored in said opening, and a stable retreat position, whereat said shutter is withdrawn from said opening so as to free the component to be stored in said opening, said shutter having a protrusion extending downward from a base of said shutter at a lateral side of each of said component storage compartments, wherein said shutter is operable to move between the projection position and the retreat position by applying an urging force to said protrusion of said shutter until said shutter is in the retreat position, and when said shutter is in the retreat position, said shutter is operable to maintain the retreat position without having the urging force applied thereto;

a conveyor device for conveying said component holder along a conveying direction such that said opening of each of said component storage compartments is facing upward, said conveying device being adapted to convey each of said component storage compartments of said component holder from an upstream position to a working position, and from the working position to a downstream position;

a shutter opening device located at the upstream position for moving said shutter of each of said component storage compartments to the retreat position so as to open said shutter;

a component placement device located at the working position for placing a component in said opening of each of said component storage compartments;

an incomplete-storage sensor located between the working position and the downstream position for detecting an incomplete-storage state of the component placed in the opening of each of the component storage compartments, and for generating an incomplete-storage signal if the incomplete-storage state is detected;

a component presence sensor located between the working position and the downstream position for detecting the presence of a component in the opening of each of the component storage compartments, and for generating a non-storage signal if the presence of a component is not detected;

a control unit for stopping the conveying of said component storage compartments of said component holder when at least one of the incomplete-storage signal and the non-storage signal has been generated; and a shutter closing device located at the downstream position for moving said shutter of each of said component storage compartments to the projection position while said conveyor device conveys each component storage compartment along the conveying direction so as to close said shutter of each component storage compartment storing a component.

6. The component taping apparatus of claim 5, wherein said component holder comprises a plurality of holder units, each of said holder units being formed of flexible synthetic resin and including one of said component storage compartments and a flange integrally molded around said opening of each of said component storage compartments, each of said holder units having a flange front edge including an integrally-molded right coupling hole and an integrally-molded left coupling hole, and having a flange rear edge including an integrally-molded right hook and an integrally-molded left hook, said component holder being formed by arranging said plurality of holder units so that said flange front edge of a first holder unit faces a flange rear edge of an adjacent second holder unit and so that said coupling holes of said flange front edge of said first holder unit engage said hooks of said flange rear edge of said second holder unit.

7. The component taping apparatus of claim 6, further comprising a presser member for pressing said component holder at the upstream position and the downstream position so as to prevent movement of said component holder during the movement of said shutter, and so as to prevent said component holder from being mis-positioned during the detection of an incomplete-storage state.

8. The component taping apparatus of claim 5, further comprising a presser member for pressing said component holder at the upstream position and the downstream position so as to prevent movement of said component holder during the movement of said shutter, and so as to prevent said component holder from being mis-positioned during the detection of an incomplete-storage state.

9. The component taping apparatus of claim 5, wherein said component holder includes a plurality of feed holes arranged along each side of said component holder, and said conveyor device includes a pair of sprockets for engaging said feed holes, the apparatus further comprising:
- a pair of guide members for guiding said component holder along the conveying direction parallel to a longitudinal axis of said component holder when said component holder is conveyed by said conveying device;
- a support member for supporting said pair of guide members such that a position of each of said pair of guide members can be individually adjusted to one of a plurality of adjustment positions corresponding to a width of said component holder;
- a positioning device for positioning and holding each of said pair of guide members at a required one of said plurality of adjustment positions; and
- a linkage device connected to one of said pair of sprockets and a corresponding one of said pair of guide members such that a position of said one of said pair of sprockets is adjusted when a position of said corresponding one of said pair of guide members is adjusted.

10. The component taping apparatus of claim 6, further comprising:
- a feed reel for storing said component holder and for feeding said component holder to said conveyor device;
- a wind-up reel for winding and storing said component holder having the components stored therein so as to form taped components conveyed by said conveying device, each of said feed reel and said wind-up reel having a reel flange operable to be moved along an axis of a rotating shaft of said feed reel and along an axis of a rotating shaft of said wind-up reel, respectively; and
- a reel flange-positioning device for engaging and holding said reel flange of said feed reel and said reel flange of said wind-up reel at a required one of a plurality of reel adjustment positions corresponding to a width of said component holder.

11. The component taping apparatus of claim 10, wherein said component holder comprises a plurality of holder units, each of said holder units being formed of flexible synthetic resin and including one of said component storage compartments and a flange integrally molded around said opening of each of said component storage compartments, each of said holder units having a flange front edge including an integrally-molded right coupling hole and an integrally-molded left coupling hole, and having a flange rear edge including an integrally-molded right hook and an integrally-molded left hook, said component holder being formed by arranging said plurality of holder units so that said flange front edge of a first holder unit faces a flange rear edge of an adjacent second holder unit and so that said coupling holes of said flange front edge of said first holder unit engage said hooks of said flange rear edge of said second holder unit.

12. The component taping apparatus of claim 10, further comprising:
- a setting device for setting a component holder intermittent feed amount corresponding to a number of component storage units to be made available for placing a component therein by said component placement device during a single intermittent conveyance stop; and
- a setting control unit for driving said conveying device in steps according to the component holder intermittent feed amount set by said setting device.

13. The component taping apparatus of claim 10, further comprising a presser member for pressing said component holder at the upstream position and the downstream position so as to prevent movement of said component holder during the movement of said shutter, and so as-to prevent said component holder from being mis-positioned during the detection of an incomplete-storage state.

14. The component taping apparatus of claim 9, further comprising:
- a setting device for setting a component holder intermittent feed amount corresponding to a number of component storage units to be made available for placing a component therein by said component placement device during a single intermittent conveyance stop; and
- a setting control unit for driving said conveying device in steps according to the component holder intermittent feed amount set by said setting device.

15. The component taping apparatus of claim 9, wherein said component holder comprises a plurality of holder units, each of said holder units being formed of flexible synthetic resin and including one of said component storage compartments and a flange integrally molded around said opening of each of said component storage compartments, each of said holder units having a flange front edge including an integrally-molded right coupling hole and an integrally-molded left coupling hole, and having a flange rear edge including an integrally-molded right hook and an integrally-molded left hook, said component holder being formed by arranging said plurality of holder units so that said flange front edge of a first holder unit faces a flange rear edge of an adjacent second holder unit and so that said coupling holes of said flange front edge of said first holder unit engage said hooks of said flange rear edge of said second holder unit.

16. The component taping apparatus of claim 9, further comprising a presser member for pressing said component holder at the upstream position and the downstream position so as to prevent movement of said component holder during the movement of said shutter, and so as to prevent said component holder from being mis-positioned during the detection of an incomplete-storage state.

17. The component taping apparatus of claim 5, further comprising:
- a setting device for setting a component holder intermittent feed amount corresponding to a number of component storage units to be made available for placing a component therein by said component placement device during a single intermittent conveyance stop; and
- a setting control unit for driving said conveying device in steps according to the component holder intermittent feed amount set by said setting device.

18. The component taping apparatus of claim 17, wherein said component holder comprises a plurality of holder units, each of said holder units being formed of flexible synthetic resin and including one of said component storage compartments and a flange integrally molded around said opening of each of said component storage compartments, each of said holder units having a flange front edge including an integrally molded right coupling hole and an integrally-molded left coupling hole, and having a flange rear edge including an integrally-molded right hook and an integrally-molded left hook, said component holder being formed by arranging said plurality of holder units so that said flange front edge of a first holder unit faces a flange rear edge of an adjacent second holder unit and so that said coupling holes of said flange front edge of said first holder unit engage said hooks of said flange rear edge of said second holder unit.

19. The component taping apparatus of claim 17, further comprising a presser member for pressing said component holder at the upstream position and the downstream position so as to prevent movement of said component holder during the movement of said shutter, and so as to prevent said component holder from being mis-positioned during the detection of an incomplete-storage state.

20. The component taping apparatus of claim 17, wherein said control unit is operable to drive said conveyor device a final feed amount Corresponding to a remainder of said component storage compartments when a total number of component storage compartments of said component holder is indivisible by the component holder intermittent feed amount.

21. The component taping apparatus of claim 20, wherein said component holder comprises a plurality of holder units, each of said holder units being formed of flexible synthetic resin and including one of said component storage compartments and a flange integrally molded around said opening of each of said component storage compartments, each of said holder units having a flange front edge including an integrally-molded right coupling hole and an integrally-molded left coupling hole, and having a flange rear edge including an integrally-molded right hook and an integrally-molded left hook, said component holder being formed by arranging said plurality of holder units so that said flange front edge of a first holder unit faces a flange rear edge of an adjacent second holder unit and so that said coupling holes of said flange front edge of said first holder unit engage said hooks of said flange rear edge of said second holder unit.

22. The component taping apparatus of claim 20, further comprising a presser member for pressing said component holder at the upstream position and the downstream position so as to prevent movement of said component holder during the movement of said shutter, and so as to prevent said component holder from being mis-positioned during the detection of an incomplete-storage state.

* * * * *

UNITED STATES PATENT AND TRADEMARK OFFICE
CERTIFICATE OF CORRECTION

PATENT NO.      : 6,571,530 B1
DATED           : June 3, 2003
INVENTOR(S)     : Osamu Hikita et al.

It is certified that error appears in the above-identified patent and that said Letters Patent is hereby corrected as shown below:

Title page,
Item [73], Assignee, change "Matsushita Electric Industrial Co., Ltd," to
-- Matsushita Electric Industrial Co., Ltd., --.

Column 26,
Line 8, change "as-to" to -- as to --.
Line 63, change "grally molded" to -- grally-molded --.

Column 27,
Line 14, change "Corresponding" to -- corresponding --.

Signed and Sealed this

Eighteenth Day of May, 2004

JON W. DUDAS
*Acting Director of the United States Patent and Trademark Office*